(12) United States Patent
Ochimizu et al.

(10) Patent No.: US 7,449,379 B2
(45) Date of Patent: Nov. 11, 2008

(54) SEMICONDUCTOR DEVICE AND METHOD FOR FABRICATING THE SAME

(75) Inventors: Hirosato Ochimizu, Kawasaki (JP); Yasuyoshi Mishima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/272,342

(22) Filed: Nov. 14, 2005

(65) Prior Publication Data
US 2006/0068557 A1  Mar. 30, 2006

Related U.S. Application Data

(63) Continuation of application No. PCT/JP03/09885, filed on Aug. 5, 2003.

(51) Int. Cl.
*H01L 21/8238* (2006.01)
(52) U.S. Cl. ............... 438/199; 438/217; 257/E29.193
(58) Field of Classification Search .......... 438/275–278, 438/199–217; 257/E29.193
See application file for complete search history.

(56) References Cited

U.S. PATENT DOCUMENTS

| | | | |
|---|---|---|---|
| 5,461,243 A | 10/1995 | Ek et al. | |
| 5,759,898 A | 6/1998 | Ek et al. | |
| 6,339,232 B1 | 1/2002 | Takagi | |
| 6,713,779 B2 * | 3/2004 | Tezuka et al. | 257/19 |
| 6,858,503 B1 * | 2/2005 | Ngo et al. | 438/285 |
| 2002/0168802 A1 | 11/2002 | Hsu et al. | |
| 2004/0026765 A1 * | 2/2004 | Currie et al. | 257/616 |
| 2005/0260809 A1 * | 11/2005 | Tezuka et al. | 438/199 |

FOREIGN PATENT DOCUMENTS

| | | |
|---|---|---|
| EP | 0 651 439 | 5/1995 |
| JP | 7-169926 | 7/1995 |
| JP | 7-230952 | 8/1995 |
| JP | 9-219524 | 8/1997 |
| JP | 2001-160594 | 6/2001 |
| JP | 2001-257351 | 9/2001 |
| JP | 2003-158250 | 5/2003 |

OTHER PUBLICATIONS

Chinese Office Action dated May 9, 2008, corresponding to Chinese Application No. 038265982.

* cited by examiner

*Primary Examiner*—H. Jey Tsai
(74) *Attorney, Agent, or Firm*—Westerman, Hattori, Daniels & Adrian, LLP.

(57) ABSTRACT

On an insulation layer 12 formed on a silicon substrate 10, there are formed in an NMOS transistor region 16 an NMOS transistor 14 comprising a silicon layer 34, a lattice-relaxed silicon germanium layer 22 formed on the silicon layer 34, a tensile-strained silicon layer 24 formed on the silicon germanium layer 22 and a gate electrode 28 formed on the silicon layer 24 with a gate insulation film 26 formed therebetween and in a PMOS transistor region 20 a PMOS transistor 18 comprising a silicon layer 34, a compression-strained silicon germanium layer formed on the silicon layer 34 and a gate electrode 28 formed on the silicon germanium layer 36 with a gate insulation film 26 formed therebetween.

15 Claims, 23 Drawing Sheets

LASER BEAM

SEMICONDUCTOR DEVICE AND METHOD FOR FABRICATING THE SAME

CROSS REFERENCE TO RELATED APPLICATIONS

This application is a Continuation of International Application No. PCT/JP03/09885, with an international filing date of Aug. 5, 2003, which designated the United States of America.

TECHNICAL FIELD

The present invention relates to a semiconductor device and a method for fabricating the same, more specifically, a semiconductor device comprising transistors using a tensile-strained silicon layer and a compression-strained silicon germanium layer, and a method for fabricating the same.

BACKGROUND ART

Recently, the heterostructure of silicon and silicon germanium is used for the higher performance of the MOS transistor using silicon.

As one technique of improving the performance of the NMOS transistor, it is known to form a tensile-strained silicon layer on a lattice-relaxed silicon germanium layer to use the silicon layer as the channel. As methods of forming a lattice-relaxed silicon germanium layer are known the method of forming a silicon germanium layer sufficiently thick, the method of forming a silicon germanium layer relatively thin on a silicon layer formed on an insulation film and lattice-relaxing the silicon germanium layer by thermal processing, and other methods. As one technique for improving the performance of the PMOS transistor is known the method of forming a compression-strained silicon germanium layer on a silicon substrate to use the silicon germanium layer as the channel.

Furthermore, as transistors are increasingly downsized, the parasitic capacitance decrease and the short channel effect prevention are more required. As a method for meeting these requirements, the SOI (Silicon On Insulator) structure, in which a channel layer, etc. are provided on a silicon layer on an insulation film, is noted.

Conventionally, a tensile-strained silicon layer has been formed on the SOI structure as follows.

First, a compression-strained silicon germanium layer is formed on a silicon substrate. Then, oxygen is implanted into the silicon substrate by SIMOX (Separation by Implanted Oxygen) to form an insulation layer of silicon oxide film below the silicon germanium layer. Then, the compression-strained silicon germanium layer is lattice-relaxed by high temperature thermal processing at, e.g., 1200° C. Then, a tensile-strained silicon layer is formed on the lattice-relaxed silicon germanium layer.

Otherwise, a compression-strained silicon germanium layer is formed on an SOI substrate with a silicon layer formed on a silicon substrate with a silicon oxide film formed therebetween. Next, the surface of the lattice-relaxed silicon germanium layer is oxidized by thermal oxidation and removed, and then a tensile-strained silicon layer is formed on the lattice-relaxed silicon germanium layer.

For the low electric power consumption, it is necessary to combine an NMOS transistor and a PMOS transistor to thereby form an integrated transistor. However, in the MOS transistor using the above-described strained silicon layer or silicon germanium layer as the channel, the strain states required for the NMOS transistor and the PMOS transistor are different from each other. Accordingly, it is difficult to integrate the NMOS transistor and the PMOS transistor on one and the same substrate.

As a method for integrating on one and the same substrate an NMOS transistor using a tensile-strained silicon layer as the channel and a PMOS transistor using a compression-strained silicon germanium layer as the channel is known the method disclosed in, e.g., Patent Reference 1 (Japanese Patent Application Unexamined Publication No. Hei 9-219524).

In the method disclosed in Patent Reference 1, a lattice-relaxed silicon germanium layer as the base layer for forming a tensile-strained silicon layer used as the channel of the NMOS transistor, and a compression-strained silicon germanium layer used as the channel of the PMOS transistor are formed as follows.

First, in a region of an SOI substrate having a silicon layer formed on a silicon substrate with an insulation layer formed therebetween, where the PMOS transistor is to be formed, an opening is formed down to the silicon substrate.

Then, a silicon germanium layer is formed by epitaxial process on the entire surface of the SOI substrate with the opening formed in.

Then, the silicon germanium layer formed on the silicon layer of the SOI substrate is lattice-relaxed by thermal processing. At this time, the thickness of the silicon germanium layer is below a critical film thickness determined by a germanium composition ratio and deposition temperature, whereby the silicon germanium layer formed on the silicon substrate exposed in the opening can be compression-strained.

As described above, in the method disclosed in Patent Reference 1, the silicon germanium layer formed on the SOI substrate is lattice-relaxed in the region where the NMOS transistor is to be formed and compression-strained in the region where the PMOS transistor is to be formed. To this end, it is necessary to form in advance the opening down the silicon substrate in the region where the PMOS transistor is to be formed. Because of no insulation layer below the compression-strained silicon germanium layer in the region where the PMOS transistor is to be formed, resultant disadvantages will be as follows.

First, because of no insulation film between the compression-strained silicon germanium layer to be used as the channel of the PMOS transistor and the silicon substrate, effects of decreasing the capacitance, etc., which are characteristic of the SOI structure, is deteriorated.

Because of no insulation film below the silicon germanium layer in the region where the PMOS transistor is to be formed, a large step is formed between the region where the NMOS transistor is to be formed and the region where the PMOS transistor is to be formed. Accordingly, the flatness of the surface of the substrate cannot be ensured, which will make it difficult to prevent the decrease of the processing precision.

Furthermore, to the conventional method using the above-described strained semiconductor layers, the technique for controlling the strain of the semiconductor layers based on the once formed and strained silicon germanium layer is very important. However, in order to lattice-relax the compression-strained silicon germanium layer, high-temperature and long-time thermal processing has been so far required. Accordingly, even the semiconductor layer, etc. which require no heating are heated, and resultantly this thermal processing has often generated defects, changed impurity profiles, etc., which have decided the device characteristics.

An object of the present invention is to provide a semiconductor device having a tensile-strained silicon layer and a compression-strained silicon germanium layer formed in good alignment with each other on one and the same substrate, and a method for fabricating the same.

Another object of the present invention is to provide a method for fabricating a semiconductor device which allows a strain of the silicon germanium layer to be controlled selectively in a short period of time, and a method for fabricating the semiconductor device.

DISCLOSURE OF INVENTION

According to one aspect of the present invention, there is provided a semiconductor device comprising: an insulation layer formed on a substrate; a silicon layer formed on the insulation layer; a first transistor including a lattice-relaxed silicon germanium layer formed on the silicon layer in a first region, a tensile-strained silicon layer formed on the lattice-relaxed silicon germanium layer and a first gate electrode formed on the tensile-strained silicon layer with a first gate insulation film formed therebetween; and a second transistor including a compression-strained silicon germanium layer formed on the silicon layer in a second region, and a second gate electrode formed on the compression-strained silicon germanium layer with a second gate insulation film formed therebetween.

According to another aspect of the present invention, there is provided a method for fabricating a semiconductor device comprising the steps of: forming a lattice-relaxed silicon germanium layer on a silicon layer in a first region, the silicon layer being formed on a substrate with an insulation layer formed therebetween; forming a tensile-strained silicon layer on the lattice-relaxed silicon germanium layer; and forming a compression-strained silicon germanium layer on the silicon layer in a second region, an NMOS transistor having the tensile-strained silicon layer as a channel and a PMOS transistor having the compression-strained silicon germanium layer as a channel being formed.

According to further another aspect of the present invention, there is provided a method for fabricating a semiconductor device comprising the steps of: forming a compression-strained silicon germanium layer on a silicon layer formed on a substrate with an insulation layer formed therebetween; and applying an energy beam to the compression-strained silicon germanium layer to lattice-relax the compression-strained silicon germanium layer.

According to the present invention, on a silicon layer formed on a substrate with an insulation layer formed therebetween in a first region, a lattice-relaxed silicon germanium layer is formed, and a tensile-strained silicon layer is formed on the lattice-relaxed silicon germanium layer, and on the silicon layer in a second region, a compression-strained silicon germanium layer is formed, whereby an NMOS transistor using the tensile-strained silicon layer as the channel, and a PMOS transistor using the compression-strained silicon germanium layer as the channel are formed. Thus, the integrated transistor of high performance can be provided without impairing the effects of the SOI structure, such as the parasitic capacitance decrease, the electric power saving, etc.

According to the present invention, it is not necessary to remove the insulation layer on the substrate, which allows the step between the height of the surface of the tensile-strained silicon layer in the first region and the height of the surface of the compression-strained silicon germanium layer to be set in a range where the processing precision of the fabrication process can be ensured.

According to the present invention, the compression-strained silicon germanium layer is formed on the silicon layer formed on the substrate with the insulation layer formed therebetween, an energy beam is applied to the compression-strained silicon germanium layer to thereby lattice-relax the compression-strained silicon germanium layer, whereby the strained state of the silicon germanium layer can be selectively controlled in a short period of time. When it is not so necessary to improve the characteristics of the PMOS transistor, both the NMOS transistor and the PMOS transistor can use the tensile-strained silicon layer as the channels.

BEST MODE FOR CARRYING OUT THE INVENTION

A First Embodiment

Figure 1:
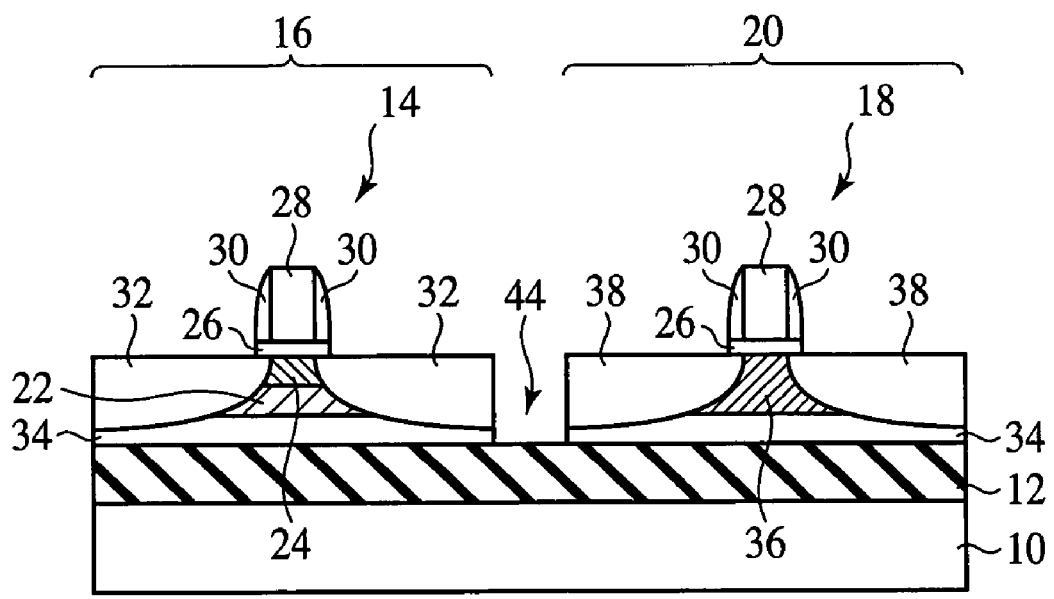
FIG. 1 is a sectional view of the semiconductor device according to a first embodiment of the present invention, which illustrates a structure thereof.

The semiconductor device and the method for fabricating the same according to a first embodiment of the present invention will be explained with reference to FIGS. 1 to 5D. FIG. 1 is a sectional view of the semiconductor device according to the present embodiment, which illustrates a structure thereof. FIGS. 2A to 5D are sectional views of the semiconductor device according to the present embodiment in the steps of the method for fabricating the same, which illustrate the method.

First, the structure of the semiconductor device according to the present embodiment will be explained with reference to FIG. 1.

An insulation layer 12 of silicon oxide film is formed on a silicon substrate 10.

On the silicon substrate 10 with the insulation film 12 formed on, an NMOS transistor region 16 where an NMOS transistor 14 is formed and a PMOS transistor region 20 where a PMOS transistor 18 is formed are provided. The NMOS transistor region 16 and the PMOS transistor region 20 are isolated from each other by a trench 44 formed down to the insulation layer 12.

On the insulation layer 12 in the NMOS transistor region 16, a silicon layer 34 is formed. On the silicon layer 34, a lattice-relaxed silicon germanium layer 22 is formed. On the silicon germanium layer 22, a tensile-strained silicon layer 24 is formed. On the silicon layer 24, a gate electrode 28 is formed with a gate insulation film 26 formed therebetween. A sidewall insulation film 30 is formed on the side wall of the gate electrode 28. Source/drain diffused layers 32 with a dopant impurity implanted in are formed in the silicon layer 24 and the silicon germanium layer 22 on both sides of the gate electrode 28. Thus, in the NMOS transistor region 16, the NMOS transistor 14 including the gate electrode 28 and the source/drain diffused layers 32 and having the tensile-strained silicon layer 24 as the channel is formed.

On the insulation layer 12 in the PMOS transistor region 20, the silicon layer 34 is formed. On the silicon layer 34, a compression-strained silicon germanium layer 36 is formed. On the silicon germanium layer 36, a gate electrode 28 is formed with a gate insulation film 26 formed therebetween. A sidewall insulation film 30 is formed on the side wall of the gate electrode 28. Source/drain diffused layers 38 with a dopant impurity implanted in are formed in the silicon germanium layer 36 and the silicon layer 34 on both sides of the gate electrode 28. Thus, in the PMOS transistor region 20, the PMOS transistor 18 including the gate electrode 28 and the source/drain diffused layers 38 and having the compression-strained germanium layer 36 as the channel is formed.

The height of the surface of the tensile-strained silicon layer 24 in the NMOS transistor region 16 and the height of the surface of the compression-strained silicon germanium layer 36 in the PMOS transistor region 20 are substantially equal to each other.

Thus, the semiconductor device according to the present embodiment including the NMOS transistor 14 using the tensile-strained silicon layer 24 as the channel and the PMOS transistor 18 using the compression-strained silicon germanium layer 36 as the channel is constituted.

The semiconductor device according to the present embodiment is characterized mainly in that, as will be described later, the NMOS transistor 14 using the tensile-strained silicon layer 24 as the channel and the PMOS transistor 18 using the compression-strained silicon germanium layer 36 as the channel are formed on the SOI substrate, which includes the silicon layer 34 formed on the silicon substrate 10 with the insulation layer 12 formed therebetween. Thus, an integrated transistor comprising the NMOS transistor 14 and the PMOS transistor 18 of high performance formed on one and the same substrate without deteriorating effects of the capacitance decrease, electric power saving, etc., which are produced characteristically by the insulation layer 12 of the SOI structure.

The semiconductor device according to the present embodiment is characterized also in that the height of the surface of the tensile-strained silicon layer 24 in the NMOS transistor region 16 and the height of the surface of the compression-strained silicon germanium layer 36 in the PMOS transistor region 20 are substantially equal to each other. This is owing to that, as will be described later, the lattice-relaxed silicon germanium layer 22 in the NMOS transistor region 16 can be formed thin. The height of the surface of the silicon layer 24 and the height of the surface of the silicon germanium layer 36 are made substantially equal to each other, whereby the processing precision of the following fabrication process of the semiconductor device is improved.

Next, the method for fabricating the semiconductor device according to the present embodiment will be explained with reference to FIGS. 2A to 5D.

Figure 2A:
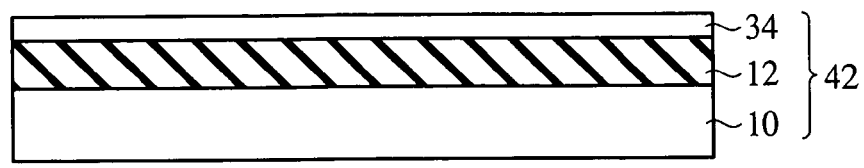
FIGS. 2A-2D are sectional views of the semiconductor device according to the first embodiment of the present invention in the steps of the method for fabricating the same, which illustrate the method (Part 1).

First, a SOI substrate 42 with a silicon layer 34 of, e.g., a 10 nm-thickness formed on a silicon substrate 10 with the insulation layer 12 of, e.g., a 200 nm-thickness silicon oxide film formed therebetween is prepared (see FIG. 2A). The SOI substrate 42 may be formed by, e.g., SIMOX, bonded SOI technique or others. As will be described later, a compression-strained silicon germanium layer 48 to be lattice-relaxed is formed on the silicon layer 34 of the SOI substrate 42. Accordingly, it is preferable to set the thickness of the silicon layer 34 at about 2-20 nm.

Figure 2B:
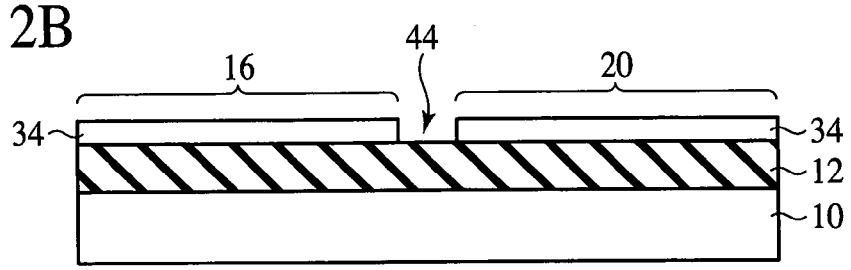
Figure 2C:
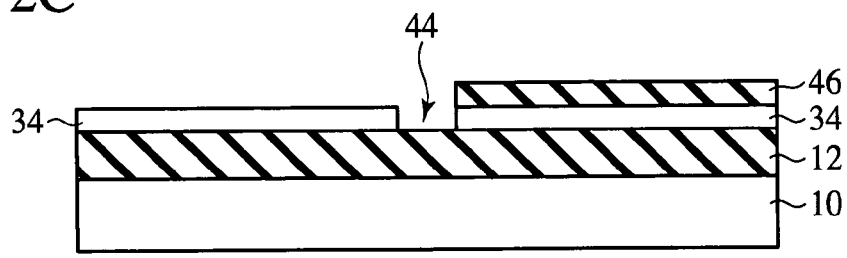

Next, a trench 44 is formed by etching in the silicon layer 34 down to the insulation layer 12 to thereby isolate the NMOS transistor region 16 and the PMOS transistor region 20 (see FIG. 2B).

Next, a silicon oxide film 46 of, e.g., a 20 nm-thickness is formed on the entire surface by, e.g., CVD. Then, the silicon oxide film 46 is patterned to leave the silicon oxide film 46 only on the silicon layer 34 in the PMOS transistor region 20 (see FIG. 2C).

Figure 2D:
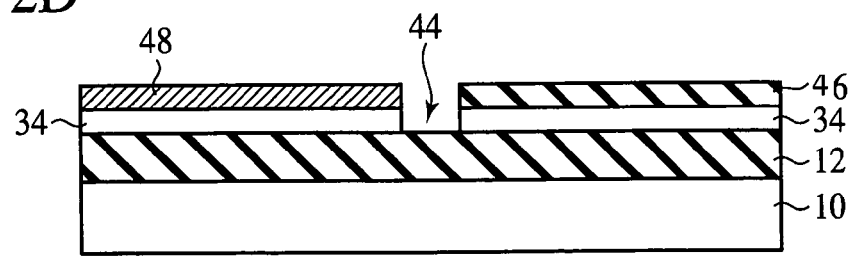

Next, a compression-strained silicon germanium layer 48 of, e.g., a 20 nm-thickness is formed on the silicon layer 34 in the NMOS transistor region 16 by selective epitaxial growth using the silicon oxide film 46 as the selective growth mask (see FIG. 2D). The composition of the silicon germanium layer 48 is, e.g., $Si_{0.72}Ge_{0.25}$.

Then, by thermal processing of, e.g., 1000° C. and 4 hours, the germanium is diffused from the compression-strained silicon germanium layer 48 into the silicon layer 34 immediately below the compression-strained silicon germanium layer 48 to thereby lattice-relax the compression-strained silicon germanium layer 48. Thus, a lattice-relaxed silicon germanium layer 22 is formed of the compression-strained silicon germanium layer 48 and the silicon layer 34 (see FIG. 3A). The composition of the lattice-relaxed silicon germanium layer 22 is, e.g., $Si_{0.83}Ge_{0.17}$.

As described above, in the method for fabricating the semiconductor device according to the present embodiment, the germanium of the compression-strained silicon germanium layer 48 is diffused by thermal processing into the silicon layer 34 to thereby form the lattice-relaxed silicon germanium layer 22. Accordingly, to form the lattice-relaxed silicon germanium layer, it is not necessary to form the silicon germanium layer thick, and the compression-strained thin silicon germanium layer 48 may be formed. Resultantly, the thickness of the lattice-relaxed silicon germanium layer 22 can be set in accordance with a thickness of the silicon germanium layer 36 in the PMOS transistor region 20, which cannot be formed thick for the purpose of retaining the compression-strained state. That is, when a thickness of the lattice-relaxed silicon germanium layer 22 is represented by $d_1$, a thickness of the silicon layer 34 of the SOI substrate 42 is represented by $d_2$, and a thickness of the compression-strained silicon germanium layer 36 is represented by $d_3$, $d_1$ can be set so that $d_2+d_1 \leq d_2+d_3$ holds.

The lattice-relaxed silicon germanium layer 22 and the compression-strained silicon germanium layer 36 are formed independently, whereby it is not necessary to remove the silicon layer 34 and the insulation layer 12 of the SOI substrate 42 in the PMOS transistor region 20.

Accordingly, the height of the surface of the tensile-strained silicon layer 24 in the NMOS transistor region 16, which will be next formed, and the height of the surface of the compression-strained silicon germanium layer 36 in the PMOS transistor region can be easily made equal to each other.

As described above, in the method for fabricating the semiconductor device according to the present embodiment, the tensile-strained silicon layer 24 and the compression-strained silicon germanium layer 36 are formed in good alignment, whereby high flatness of the substrate surface can be ensured in the fabrication process, and the processing precision can be improved.

Then, a silicon oxide film 50 of, e.g., a 20 nm-thickness is formed on the entire surface by, e.g., CVD. Subsequently, the silicon oxide films 50, 46 formed on the silicon layer 34 in the PMOS transistor region 20 are removed. Thus, the silicon oxide film 50 is left on the lattice-relaxed silicon germanium layer 22 formed in the NMOS transistor region 16, and the silicon layer 34 in the PMOS transistor region 20 is exposed (see FIG. 3B).

Then, on the silicon layer 34 in the PMOS transistor region 20, the compression-strained silicon germanium layer 36 of, e.g., a 20 nm-thickness is grown by selective epitaxial growth using the silicon oxide film 50 as the selective growth mask. The composition of the silicon germanium layer 36 is, e.g., $Si_{0.8}Ge_{0.2}$. The silicon germanium layer 36 cannot be formed very thick for the purpose of retaining the compression-strained state and is formed preferably in the thickness range of, e.g., 2-30 nm.

Figure 3A:
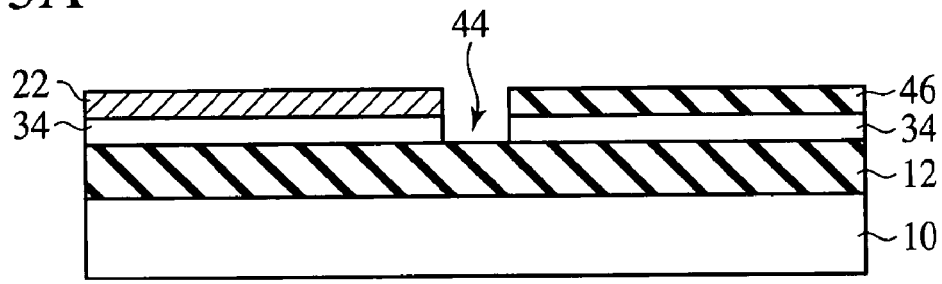
FIGS. 3A-3D are sectional views of the semiconductor device according to the first embodiment of the present invention in the steps of the method for fabricating the same, which illustrate the method (Part 2).
Figure 3B:
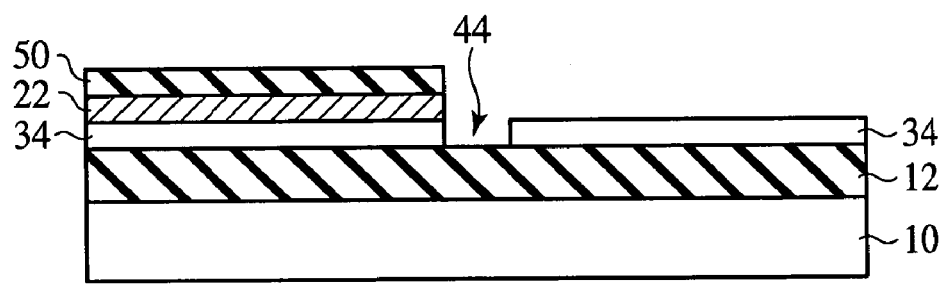
Figure 3C:
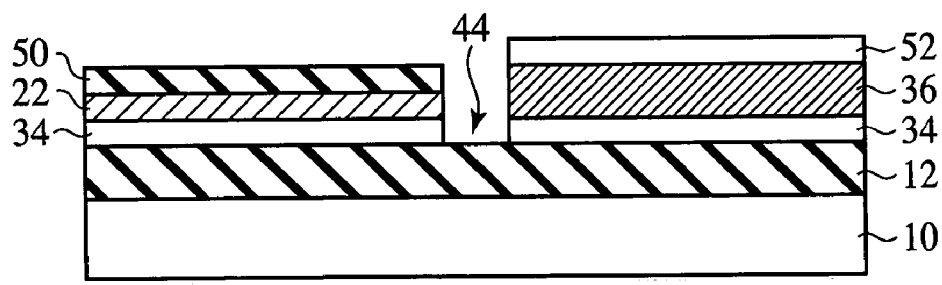
Figure 3D:
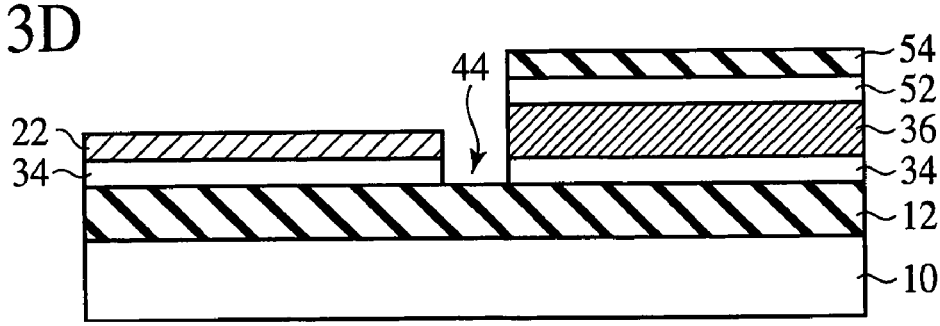

Then, a silicon layer 52 of, e.g., a 2 nm-thickness is formed on the silicon germanium layer 36 (see FIG. 3C). The silicon layer 52 is for forming a gate insulation film 26 as will be described later.

Next, a silicon oxide film 54 of, e.g., a 20 nm-thickness is formed on the entire surface by, e.g., CVD. Subsequently, the silicon oxide films 54, 50 formed on the silicon germanium layer 22 in the NMOS transistor region 20 are removed. Thus, the silicon oxide film 54 is left on the silicon layer 52 formed in the PMOS transistor region 20, and the silicon germanium layer 22 in the NMOS transistor region 16 is exposed (see FIG. 3D).

Figure 4A:
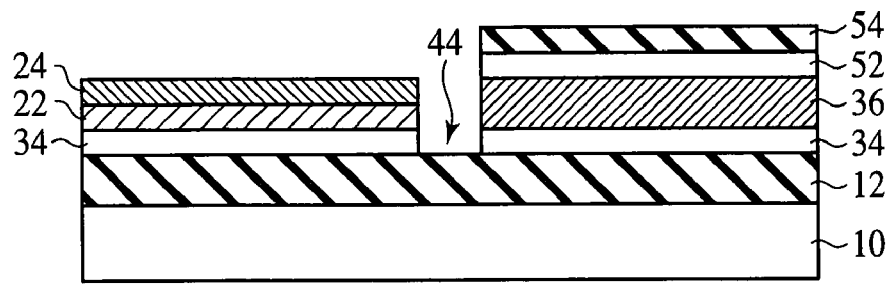
FIGS. 4A-4D are sectional views of the semiconductor device according to the first embodiment of the present invention in the steps of the method for fabricating the same, which illustrate the method (Part 3).

Then, a tensile-strained silicon layer 24 of, e.g., a 20 nm-thickness is formed on the silicon germanium layer 22 in the NMOS transistor region 16 by selective epitaxial growth using the silicon oxide film 54 as the selective growth mask (see FIG. 4A).

Figure 4B:
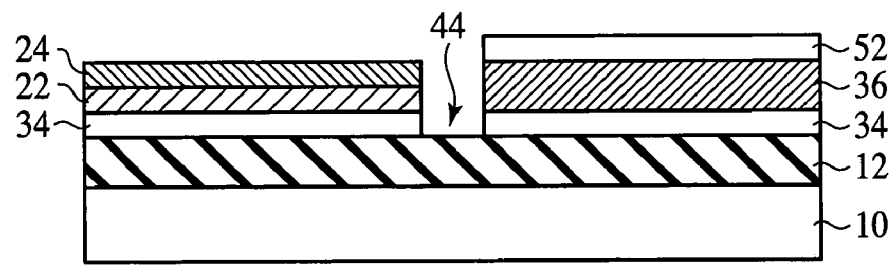

After the silicon layer 24 has been formed, the silicon oxide film 54 used as the selective growth mask is removed (see FIG. 4B).

Figure 4C:
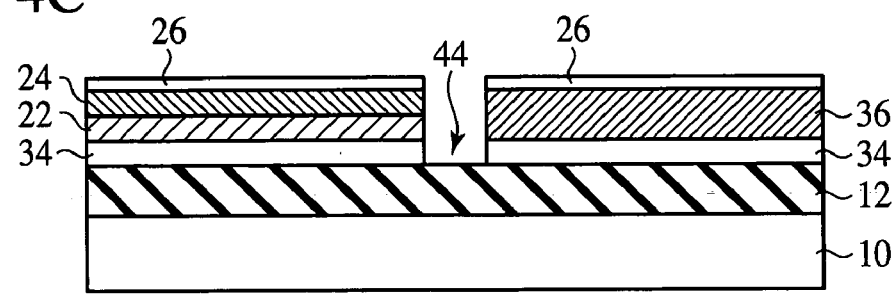

Next, a gate insulation film 26 of, e.g., a 2 nm-thickness silicon oxide film is formed by, e.g., thermal oxidation on the surface of the silicon layer 24 in the NMOS transistor region 16 and on the surface of the silicon layer 52 in the PMOS transistor region 20 (see FIG. 4C).

Then, a polysilicon film of, e.g., a 120 nm-thickness (not illustrated) is formed on the entire surface by, e.g., CVD.

Figure 4D:
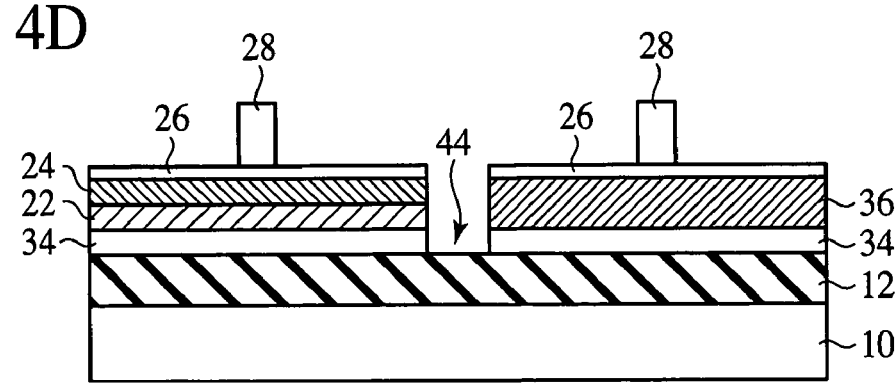

Next, the polysilicon film is patterned by photolithography and etching to form gate electrodes 28 of the polysilicon film respectively in the NMOS transistor region 16 and the PMOS transistor region 20 (see FIG. 4D).

Then, a resist film 56 is formed on the entire surface by, e.g., spin coating. Then, the resist film 56 is patterned by photolithography to form in the resist film 56 an opening 58 for exposing the NMOS transistor region 16.

Next, with the gate electrode 28 and the resist film 56 as the mask, phosphorus, for example, is ion-implanted as the dopant impurity. Thus, source/drain diffused layers 32 are formed in the silicon layer 24 and the silicon germanium layer 22 on both sides of the gate electrode 28 (see FIG. 5A).

After the source/drain diffused layers 32 have been formed, the resist film 56 used as the mask is removed.

Figure 5A:
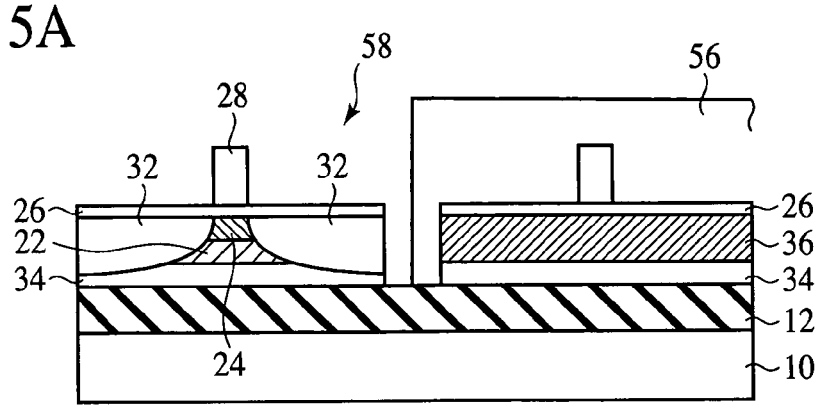
FIGS. 5A-5D are sectional views of the semiconductor device according to the first embodiment of the present invention in the steps of the method for fabricating the same, which illustrate the method (Part 4).
Figure 5B:
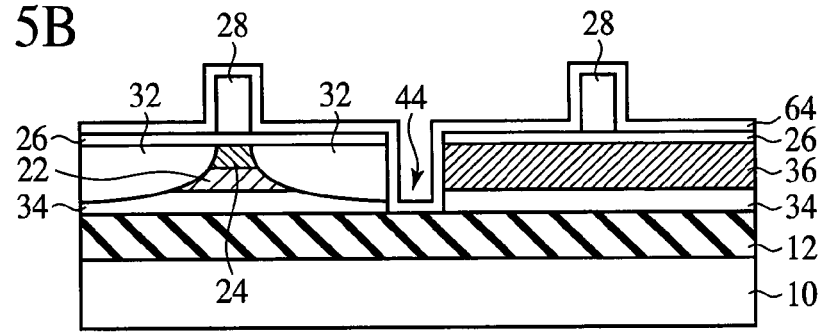

Next, a silicon oxide film 64 of, e.g., a 100 nm-thickness is formed on the entire surface by, e.g., CVD (see FIG. 5B).

Figure 5C:
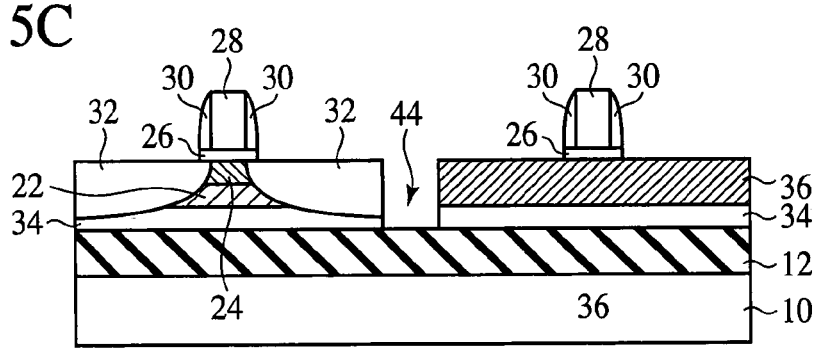
Figure 5D:
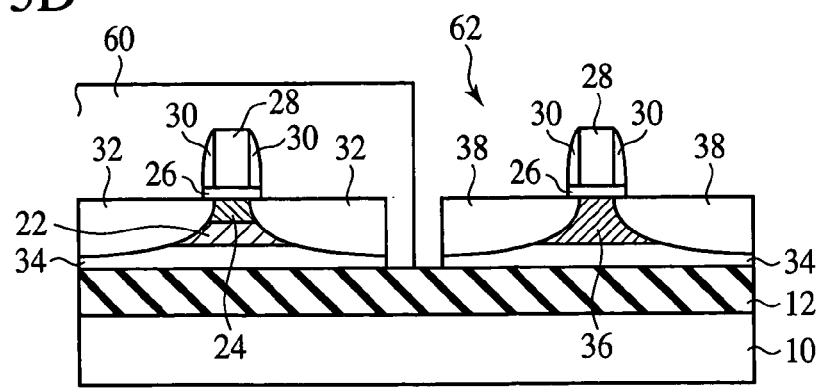

Next, the silicon oxide film 64 is anisotropically etched to form sidewall insulation films 30 of the silicon oxide film 64 on the side walls of the gate electrodes 28 (see FIG. 5C). At this time, the gate insulation film 26 exposed on both sides of the gate electrode 28 with the sidewall insulation film 30 formed on is also etched off.

Next, a resist film 60 is formed on the entire surface by, e.g., spin coating. Then, the resist film 60 is patterned by photolithography to form in the resist film 60 an opening 62 for exposing the PMOS transistor region 20.

Next, with the gate electrode 28 and the resist film 60 as the mask, boron, for example, as the dopant impurity is ion-implanted. Thus, source/drain diffused layers 38 are formed in the silicon germanium layer 36 and the silicon layer 34 on both sides of the gate electrode 28 (see FIG. 5D).

After the source/drain diffused layers 38 have been formed, the resist film 60 used as the mask is removed.

After the source/drain diffused layers 32, 38 have been formed, the dopant impurities implanted in the source/drain diffused layers 32, 38 are activated by, e.g., thermal processing.

Thus, the NMOS transistor 14 using the tensile-strained silicon layer 24 as the channel and the PMOS transistor 18 using the compression-strained silicon germanium layer 36 as the channel are formed on one and the same SOI substrate 42.

As described above, the semiconductor device according to the present embodiment illustrated in FIG. 1 is fabricated.

As described above, according to the present embodiment, the NMOS transistor 14 using the tensile-strained silicon layer 24 as the channel and the PMOS transistor 18 using the compression-strained silicon germanium layer 36 as the channel are formed on one and the same SOI substrate, whereby the integrated transistor of high performance can be provided.

It is not necessary to remove the insulation layer 12 of the SOI substrate 42 in both of the NMOS transistor region 16 and the PMOS transistor region 20, whereby effects of the SOI structure, such as the capacitance decrease, electric power saving, etc., are never deteriorated.

Furthermore, the height of the surface of the tensile-strained silicon layer 24 in the NMOS transistor region 16 and the height of the surface of the compression-strained silicon germanium layer 36 in the PMOS transistor region 20 can be made substantially equal to each other, whereby the processing precision of the following fabrication process for the semiconductor device can be improved.

In the present embodiment, the thermal processing for lattice-relaxing the silicon germanium layer 48 is conducted with the silicon oxide film 46 formed on the silicon layer 34 in the PMOS transistor region 20 but may be conducted with the insulation film of, e.g., silicon nitride film or others formed on in place of the silicon oxide layer 46.

The sequence of forming the respective layers forming the semiconductor device according to the present embodiment is not limited to the above-described sequence and can be suitably design-changed. However, in forming the lattice-relaxed silicon germanium layer 22 by the thermal processing, the lattice-relaxed silicon germanium layer 22 must be formed by the thermal processing before the compression-strained silicon germanium layer 36 in the PMOS transistor region 20 is formed.

For example, in the present embodiment, the silicon layer 24 in the NMOS transistor region 16 and the silicon layer 52 in the PMOS transistor region 20 are formed independently of each other. In contrast to this, as will be described later, the silicon layer 24 in the NMOS transistor region 16 and the silicon layer 52 in the PMOS transistor region 20 may be simultaneously formed.

First, in the same way as illustrated in FIGS. 2A to 3A, the lattice-relaxed silicon germanium layer 22 is formed in the NMOS transistor region 16.

Then, the compression-strained silicon germanium layer 36 is formed on the silicon layer 34 by selective epitaxial growth in the PMOS transistor region 20.

Next, the lattice-relaxed silicon germanium layer 22 in the NMOS transistor region 16 is exposed, and then the silicon layers 24, 52 are simultaneously formed on the lattice-relaxed silicon germanium layer 22 and on the compression-strained silicon germanium layer 36.

Hereafter, in the same way as illustrated in FIGS. 4C to 5D, the semiconductor device comprising the NMOS transistor 14 and the PMOS transistor 18 is fabricated.

As described above, the silicon layer 24 in the NMOS transistor region 16 and the silicon layer 52 in the PMOS transistor region 20 may be simultaneously formed.

A Second Embodiment

Figure 6:
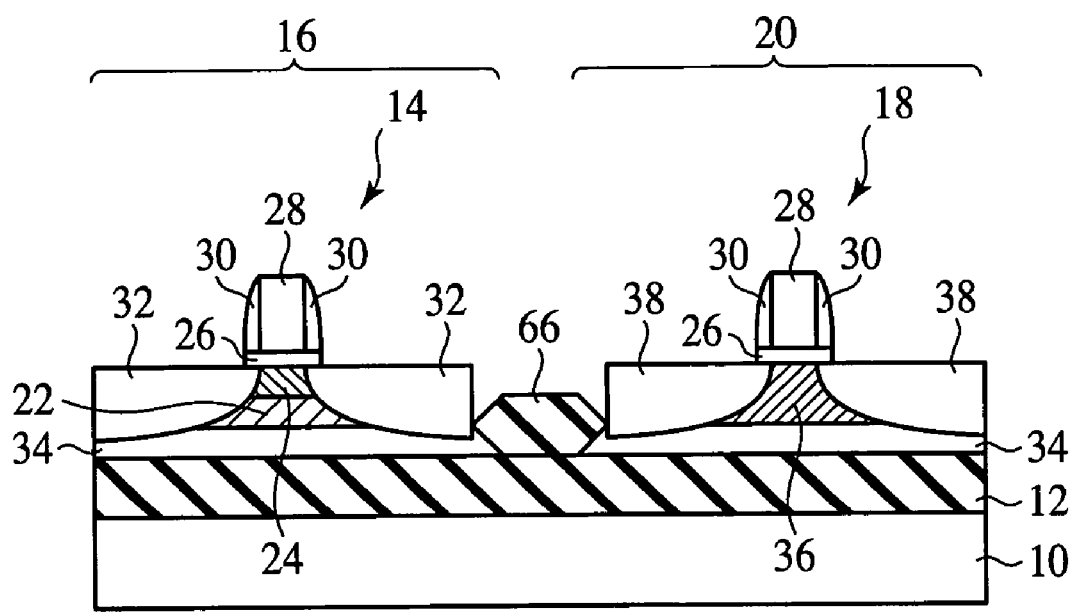
FIG. 6 is a sectional view of the semiconductor device according to a second embodiment of the present invention, which illustrates a structure thereof.

The semiconductor device and the method for fabricating the same according to a second embodiment of the present invention will be explained with reference to FIGS. 6 to 8D. FIG. 6 is a sectional view of the semiconductor device according to the present embodiment, which illustrates a structure thereof. FIGS. 7A to 8D are sectional views of the semiconductor device according to the present embodiment in the steps of the method for fabricating the same, which illustrate the method. The same members of the present embodiment as those of the semiconductor device and the method for fabricating the same according to the first embodiment are represented by the same reference numbers not to repeat or to simplify their explanation.

The structure of the semiconductor device according to the present embodiment is basically substantially the same as that of the semiconductor device according to the first embodiment. The semiconductor device according to the present embodiment is different from the semiconductor device according to the first embodiment in that, as illustrated in FIG. 6, a device isolation film 66 is formed on the silicon layer 34 of an SOI substrate 42 by LOCOS (Local Oxidation of Silicon), an NMOS transistor region 16 and a PMOS transistor region 20 are isolated from each other by the device isolation film 66.

Next, the method for fabricating the semiconductor device according to the present embodiment will be explained with reference to FIGS. 7A to 8D.

In the method for fabricating the semiconductor device according to the first embodiment, when the compression-strained silicon germanium layer 48 in the NMOS transistor region 16 is lattice-relaxed by thermal processing, the silicon oxide film 46 is formed on the silicon layer 34 in the PMOS transistor region 20.

In contrast to this, in the method for fabricating the semiconductor device according to the present embodiment, as will be described later, the lattice relaxation by thermal processing is conducted with the silicon oxide film formed not only on the silicon layer 34 in the PMOS transistor 20 but also on the compression-strained silicon germanium layer 48 in the NMOS transistor region 16.

Figure 7A:
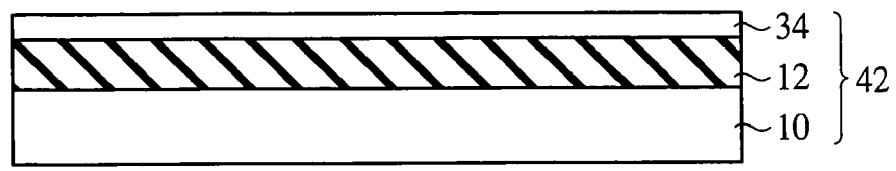
FIGS. 7A-7D are sectional views of the semiconductor device according to the second embodiment of the present invention in the steps of the method for fabricating the same, which illustrate the method (Part 1).
Figure 7B:
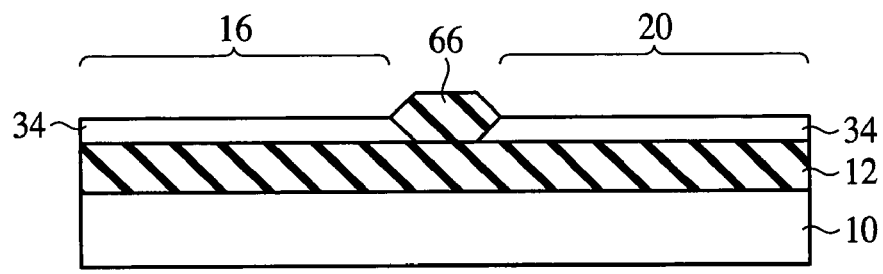

First, a device isolation film 66 is formed by LOCOS in the silicon layer 34 of the SOI substrate 42 illustrated in FIG. 7A prepared in the same way as in the method for fabricating the semiconductor device according to the first embodiment. Thus, the NMOS transistor region 16 and the PMOS transistor region are isolated by the device isolation film 66 formed in the silicon layer 34 (see FIG. 7B).

Figure 7C:
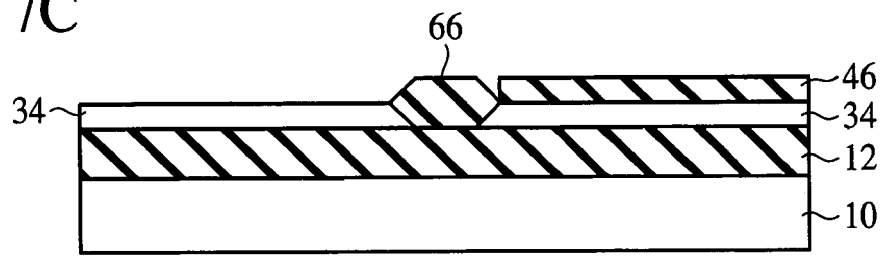

Then, a silicon oxide film 46 of, e.g., a 20 nm-thickness is formed on the entire surface by, e.g., CVD and patterned to be left only on the silicon layer 34 in the PMOS transistor region 20 (see FIG. 7C).

Figure 7D:
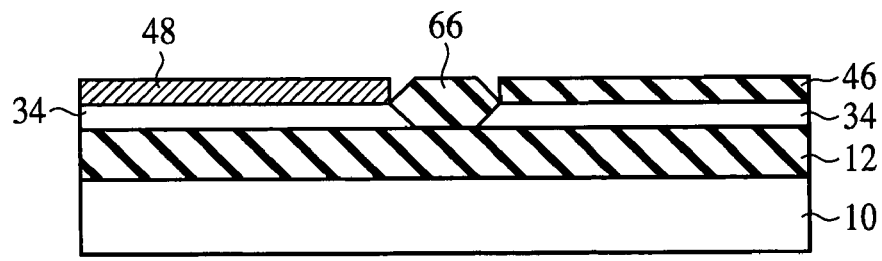
Figure 8A:
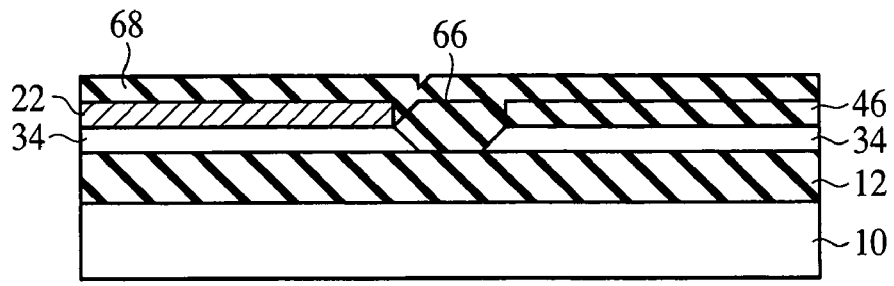
FIGS. 8A-8D are sectional views of the semiconductor device according to the second embodiment of the present invention in the steps of the method for fabricating the same, which illustrate the method (Part 2).
Figure 8B:
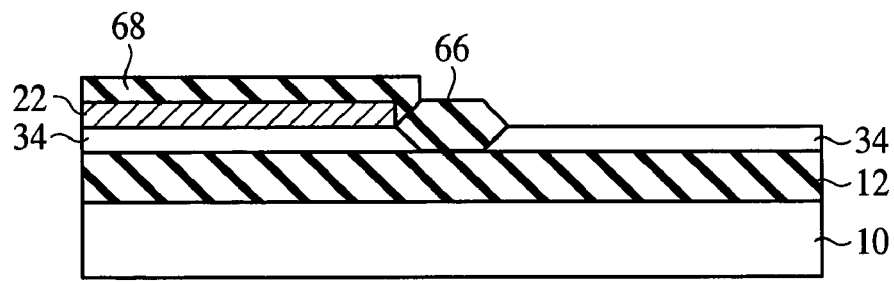
Figure 8C:
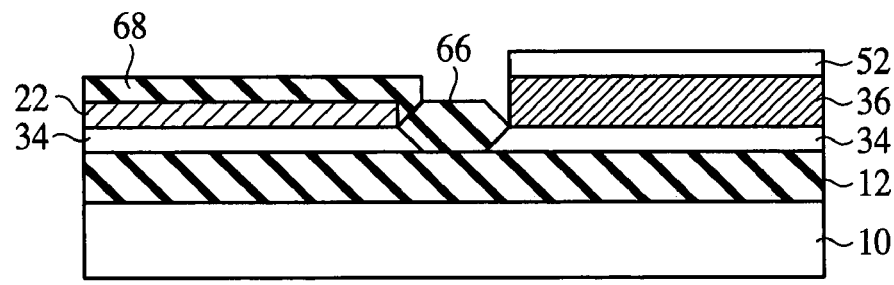
Figure 8D:
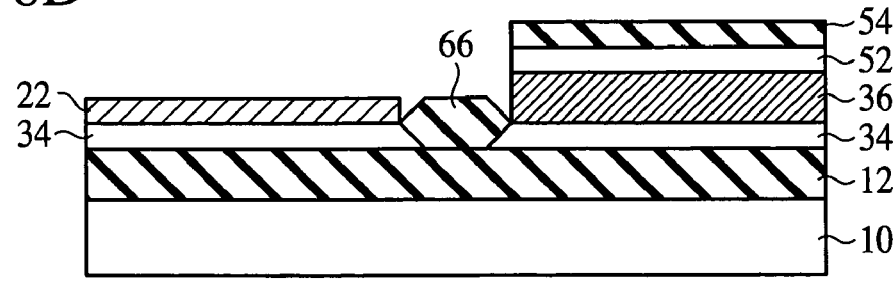

Then, a compression-strained silicon germanium layer 48 of, e.g., a 20 nm-thickness is formed on the silicon layer 34 in the NMOS transistor region 16 by selective epitaxial growth using the silicon oxide film 46 as the selective growth mask (see FIG. 7D).

Next, a silicon oxide film 68 of, e.g., a 20 nm-thickness is formed on the entire surface by, e.g., CVD.

Then, by thermal processing of, e.g., 1000° C. and 4 hours, the germanium is diffused from the compression-strained silicon germanium layer 48 into the silicon layer 34 formed immediately below the compression-strained silicon germanium layer 48 to lattice-relax the compression-strained silicon germanium layer 48. Thus, a lattice-relaxed silicon germanium layer 22 is formed on the silicon layer 34 in the NMOS transistor region 16 (see FIG. 8A). Thus, the silicon germanium layer 48 may be lattice-relaxed by thermal processing with the NMOS transistor region 16 and the PMOS transistor region 20 both covered with the silicon oxide film, as is not in the method for fabricating the semiconductor device according to the first embodiment.

Then, the silicon oxide films 68, 46 formed on the silicon layer 34 in the PMOS transistor region 20 are removed. Thus, the silicon oxide film 68 is left on the silicon germanium layer 22 in the NMOS transistor region 16, and the silicon layer 34 in the PMOS transistor region 20 is exposed (see FIG. 8B).

Then, a compression-strained silicon germanium layer 36 is formed on the silicon layer 34 in the PMOS transistor region 20 by selective epitaxial growth using the silicon oxide film 68 as the selective growth mask. Subsequently, a silicon layer 52 is formed on the silicon germanium layer 36 (see FIG. 8C).

Next, a silicon oxide film 54 is formed on the entire surface by, e.g., CVD. Subsequently, the silicon oxide films 54, 68 formed on the silicon germanium layer 22 in the NMOS transistor region 20 are removed. Thus, the silicon oxide film 54 is left on the silicon layer 52 formed in the PMOS transistor region 20, and the silicon germanium layer 22 in the NMOS transistor region 16 is exposed (see FIG. 8D).

Hereafter, in the same way as in the method for fabricating the semiconductor device according to the first embodiment illustrated in FIGS. 4A to 5D, the semiconductor device comprising the NMOS transistor 14 and the PMOS transistor 18 is fabricated.

In the present embodiment, the thermal processing for lattice-relaxing the silicon germanium layer 48 is conducted with the silicon oxide film formed on the compression-strained silicon germanium layer 48 in the NMOS transistor region 16 and the silicon layer 34 in the PMOS transistor region 20. However, the thermal processing may be conducted with the compression-strained silicon germanium layer 48 in the NMOS transistor region 16 and the silicon layer 34 in the PMOS transistor region 20 covered with an insulation film, such as e.g., a silicon nitride film or others, in place of the silicon oxide film.

A Third Embodiment

Figure 10A:
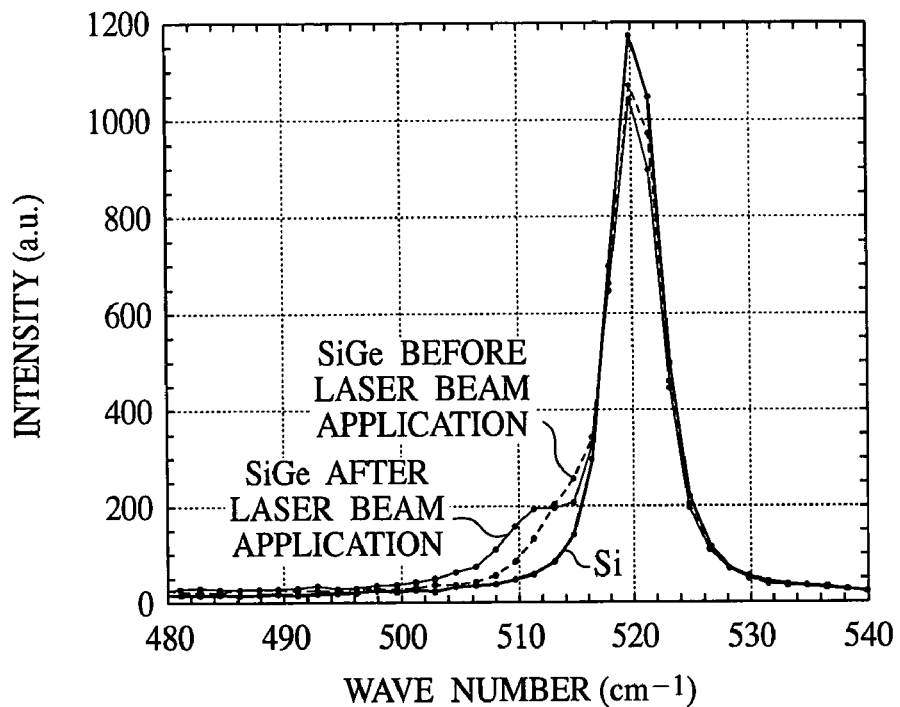
FIGS. 10A and 10B are graphs of the Raman spectra of the silicon germanium layer before and after the application of laser beams.
Figure 10B:
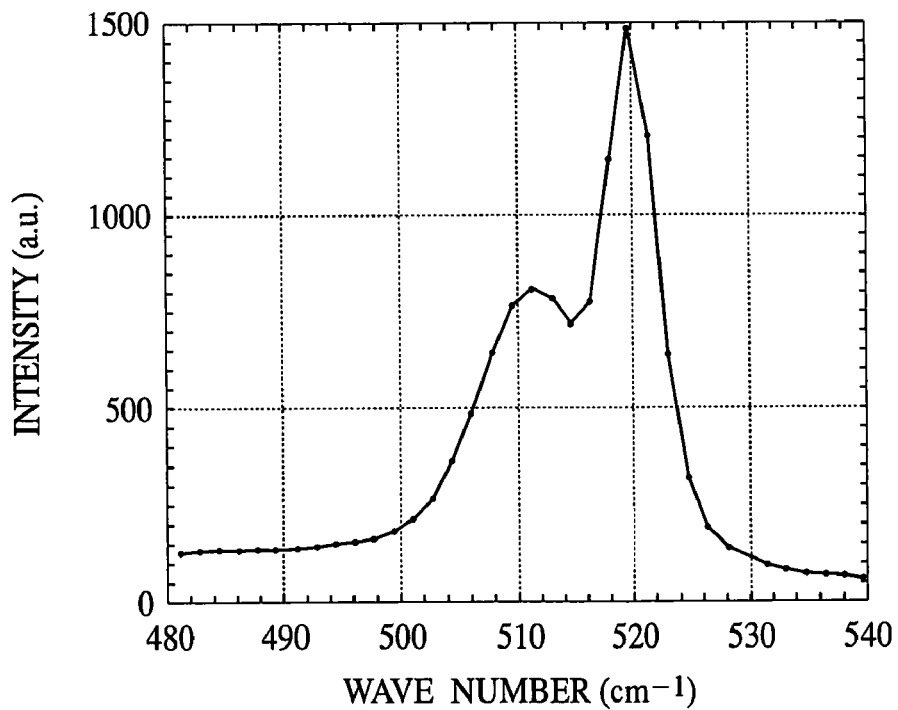
Figure 11A:
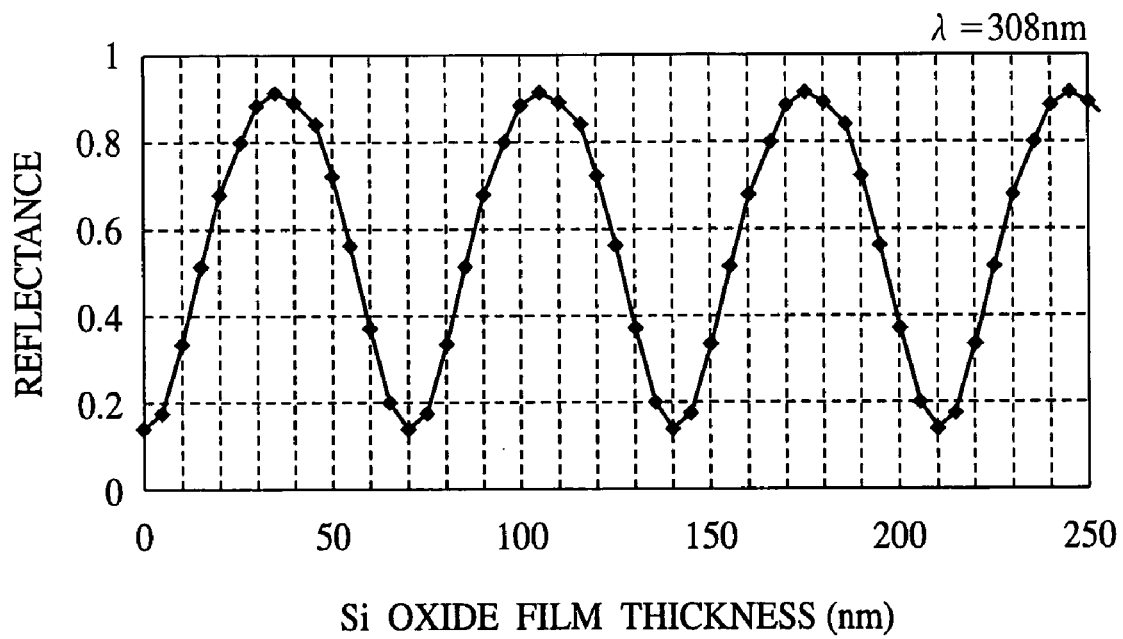
FIGS. 11A and 11B are views explaining the relationship between the thickness of the silicon oxide film and the reflectance of the laser beams.
Figure 11B:
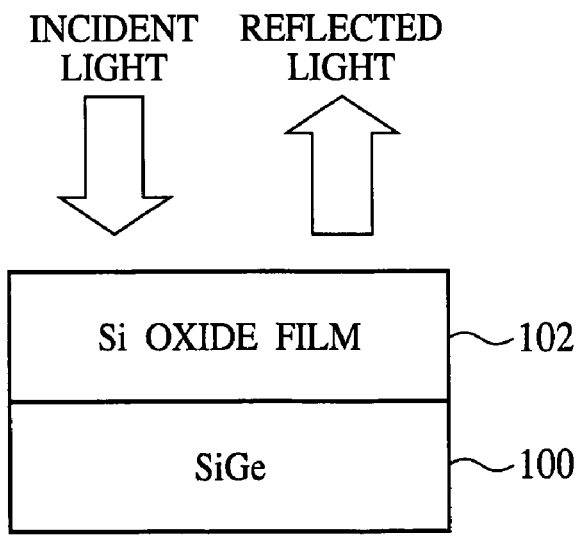
Figure 12:
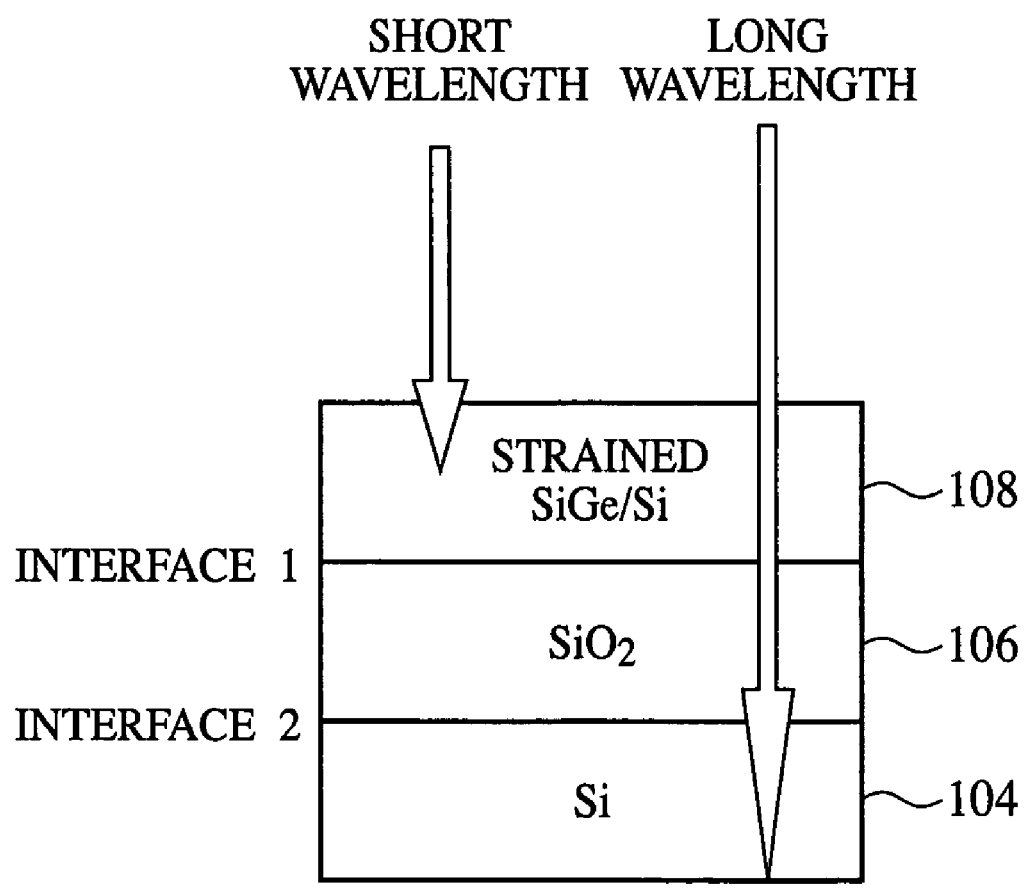
FIG. 12 is a view explaining the relationship between the wavelength of the laser beam and the lattice-relaxation.
Figure 13:
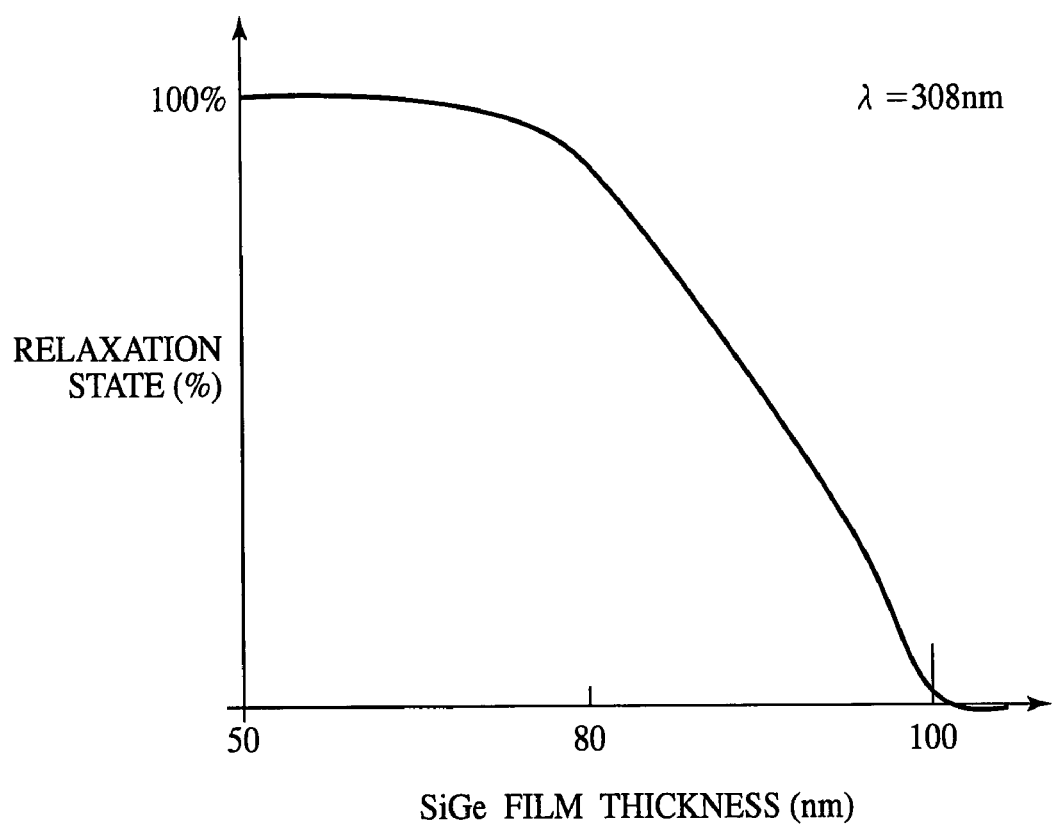
FIG. 13 is a graph schematically showing the relationship between the thickness of the silicon germanium layer and the lattice-relaxed state by the application of the laser beam.

The method for fabricating the semiconductor device according to a third embodiment of the present invention will be explained with reference to FIGS. 9A to 15B. FIGS. 9A-9D and 14A-14D are sectional views of the semiconductor device according to the present embodiment in the steps of the method for fabricating the same, which illustrate the method. FIGS. 10A and 10B are graphs of the Raman spectra of the silicon germanium layer before and after the application of a laser beam. FIGS. 11A and 11B are views explaining the relationship between the thickness of the silicon oxide film and the reflectance of a laser beam. FIG. 12 is a view explaining the relationship between the wavelength of a laser beam and the lattice relaxation. FIG. 13 is a graph schematically showing the relationship between the thickness of the silicon germanium layer and the lattice relaxation by the application of a laser beam. FIGS. 15A and 15B are views of the evaluation results. The same members of the present embodiment as those of the semiconductor device and the method for fabricating the same according to the first embodiment are represented by the same reference numbers not to repeat or to simplify their explanation.

The method for fabricating the semiconductor device according to the present embodiment is for fabricating a semiconductor device comprising an NMOS transistor 14 using a tensile-strained silicon layer 24 as the channel and a PMOS transistor using a compression-strained silicon germanium layer 36 as the channel as does the semiconductor device according to the first embodiment. The method for fabricating the semiconductor device according to the present embodiment is characterized mainly in that thermal processing using a laser beam is conducted for a short period of time on a compression-strained silicon germanium 48 formed on the silicon layer 34 of an SOI substrate 42 to form a lattice-relaxed silicon germanium layer 22.

The method for fabricating the semiconductor device according to the present embodiment will be explained in good detail with reference to FIGS. 9A to 14D.

Figure 9A:
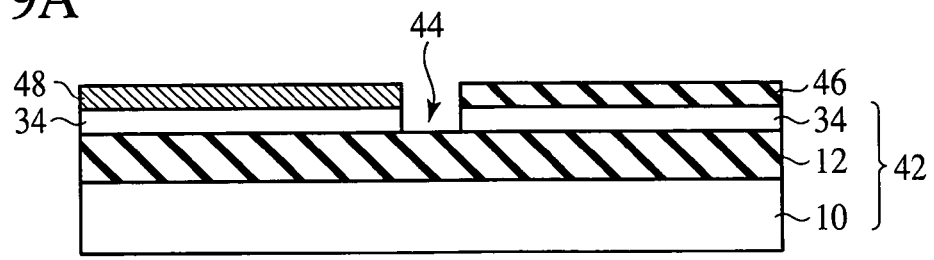
FIGS. 9A-9D are sectional views of the semiconductor device according to a third embodiment of the present invention in the steps of the method for fabricating the same, which illustrate the method (Part 1).

First, in the same way as in the method for fabricating the semiconductor device according to the first embodiment illustrated in FIGS. 2A to 2D, a trench 44 is formed in the silicon layer 34 of the SOI substrate 42 to isolate the NMOS transistor region 16 and the PMOS transistor region 20 from each other, then a compression-strained silicon germanium layer 48 of, e.g., a 40 nm-thickness is formed on the silicon layer 34 in the NMOS transistor region 16 by selective epitaxial growth using a silicon oxide film 46 as the selective growth mask (see FIG. 9A). The semiconductor layer including the thus formed compression-strained silicon germanium layer 48 is formed on the insulation layer 12, isolated in, e.g., an island-shape.

Figure 9B:
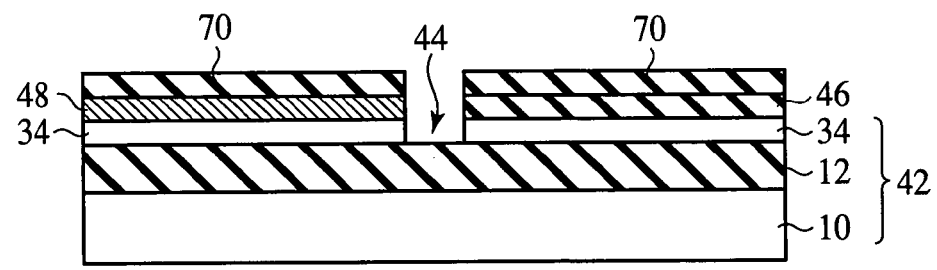
Figure 9C:
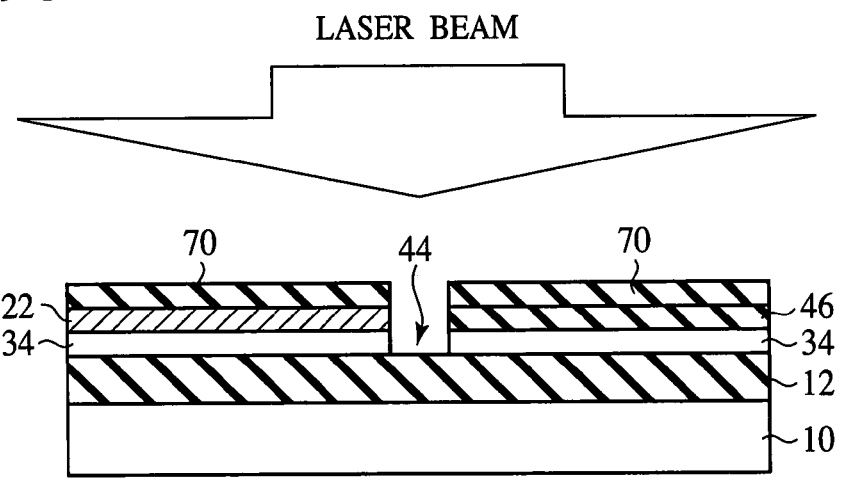
Figure 9D:
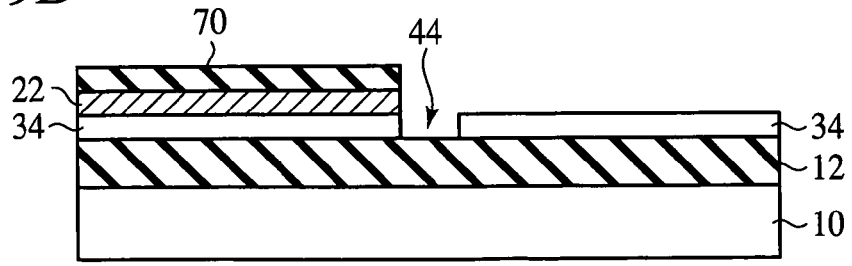

Then, a silicon oxide film 70 of, e.g., a 30 nm-thickness is formed on the entire surface by, e.g., CVD (see FIG. 9B).

Then, a pulse-like laser beam is applied to the silicon substrate 10 on the side where the silicon oxide film 70 is formed on the entire surface. A 308 nm-wavelength XeCl excimer laser, for example, is used to apply the laser beam. The intensity of the laser beam is, e.g., above 200 mJ/cm$^2$ including 200 mJ/cm$^2$, and the pulse width and the pulse number of the laser beam are, e.g., 20-40 ns and 100 times/second, respectively. The application period of time of the laser beam is as short as, e.g., 30-90 seconds. The laser beam can be processed in a prescribed area to be applied.

The compression-strained silicon germanium layer 48 is heated by the application of the laser beam. Thus, the compression-strained silicon germanium layer 48 is lattice-relaxed to be the lattice-relaxed silicon germanium layer 22 (see FIG. 9C). For the lattice-relaxation by the application of the laser beam, it is sufficient to apply once a laser beam of 10's ns, and the scan of the laser beam can process, e.g., an 8-inch wafer in 10's seconds. Thus, the time required for the lattice-relaxation by the laser beam application is much shorter than the time required for the lattice-relaxation by the high-temperature thermal processing.

Here, on the side of the silicon substrate 10 the laser beam is applied to, a 70 nm-thickness silicon oxide film 70 is formed on the silicon germanium layer 48 in the NMOS transistor region 16, and the silicon oxide films 46, 70 of a 100 nm-total thickness is formed on the silicon layer 34 in the PMOS transistor region 20. That is, silicon oxide films of different thicknesses are formed in both regions. The thickness of the silicon oxide film 70 on the silicon germanium layer 48 in the NMOS transistor region 16 and the thickness of the silicon oxide films 46, 70 on the silicon layer 34 in the PMOS transistor region 20 are suitably set, whereby the silicon germanium layer 48 is heated at a sufficient temperature for the lattice relaxation while the temperature rise of the silicon layer 34, etc. in the PMOS transistor region 20, which does not need to be heated, can be suppressed. The control of the heating with the laser beam by means of setting the thicknesses of the silicon oxide films will be detailed later.

As described above, the method for fabricating the semiconductor device according to the present embodiment is characterized mainly in that the compression-strained silicon germanium layer 48 is lattice-relaxed by the thermal processing of the short period of time by the application of the laser beam to form the lattice-relaxed silicon germanium layer 22. This makes it unnecessary to form the silicon germanium layer thick so as to form the lattice-relaxed silicon germanium layer, and the compression-strained thin germanium layer 48 may be formed. Resultantly, in the same way as in the method for fabricating the semiconductor device according to the first embodiment, the thickness of the lattice-relaxed silicon germanium layer 22 can be set in accordance with the thickness of the silicon germanium layer 36 in the PMOS transistor region 20, which is not allowed to be formed thick so as to retain the compression-strained state.

The lattice-relaxed silicon germanium layer 22 and the compression-strained silicon germanium layer 36 are formed independently of each other, which makes it unnecessary to remove the silicon layer 34 and the insulation layer 12 of the SOI substrate 42 in the PMOS transistor region 20.

Accordingly, the height of the surface of the tensile-strained silicon layer 24 in the NMOS transistor 16, which is to be formed later, and the height of the surface of the compression-strained silicon germanium layer 36 in the PMOS transistor region 20 can be easily made equal to each other.

As described above, in the method for fabricating the semiconductor device according to the present embodiment, as in the method for fabricating the semiconductor device according to the first embodiment, the tensile-strained silicon layer 24 and the compression-strained silicon germanium layer 36 can be formed in good alignment, whereby high flatness of the substrate surface can be ensured in the fabrication process, and the processing precision can be improved.

Here, the lattice-relaxation of the silicon germanium layer by the application of the laser beam, which is a main characteristic of the method for fabricating the semiconductor device according to the present embodiment, will be detailed with reference to FIGS. 10A to 13.

(a) Confirmation of the generation of the lattice-relaxation, based on the measurement of the Raman spectra First, it was confirmed by measuring the Raman spectra that the compression-strained silicon germanium layer is lattice-relaxed by the application of laser beams to be a lattice-relaxed silicon germanium layer.

The silicon germanium layer the Raman spectra were measured on was epitaxially grown on a 10 nm-thickness silicon layer formed on a silicon substrate with a silicon oxide film formed therebetween, and the thickness was 40 nm. The laser beams were applied by a 308 nm-XeCl excimer laser, and the intensity of the laser beams was 200 mJ/cm$^2$. The Raman spectra were measured for two cases, one with an insulation film on the silicon germanium layer and the other without an insulation film on the silicon germanium layer: that is, (i) the case that no insulation film is formed on the silicon germanium layer and the laser beams were applied directly to the silicon germanium layer and (ii) the case that a 30 nm-thickness silicon oxide film as the insulation film is formed on the silicon germanium layer and the laser beams were applied through the silicon oxide film.

FIG. 10A is a graph of the Raman spectra of the silicon germanium layer before and after the application of the laser beams in the case that no insulation film is formed on the silicon germanium layer. In FIG. 10A, the Raman spectrum of a silicon layer is also shown as a reference.

As evident in the graph of FIG. 10A, it is seen that the spectrum of the silicon germanium layer has the peak observed near 515 cm$^{-1}$ shifted by several cm$^{-1}$ by the application of the laser beam. Based on this result, it can be confirmed that the application of the laser beam has changed the silicon germanium layer from the compression-strained state to the lattice-relaxed state.

FIG. 10B is a graph of the Raman spectrum of the silicon germanium layer after the application of the laser beam in the case that a silicon oxide film as the insulation film is formed on the silicon germanium layer.

As evident in FIG. 10B, it is seen that in the case that an insulation film is formed on the silicon germanium layer as well, the peak near 510 cm$^{-1}$ is shifted by the application of the laser beam. Based on this result, even in the case that the laser beam is applied through the insulation film, the silicon germanium layer has changed from the compression-strained state to the lattice-relaxed state. In comparison with the case shown in FIG. 10A that no insulation film is formed, the peak shift amount and the peak height are different. This may be because the intensity of the incident laser beam has been changed due to the interference of the laser beam, and the presence amount of the germanium varies.

(b) Relationship between the thickness of the silicon oxide film and the reflectance of the laser beam Next, the relationship between the thickness of the silicon oxide film formed on the germanium layer and the reflectance of the laser beam will be explained with reference to FIGS. 11A and 11B.

FIG. 11A is a graph of the relationship between the thickness of the silicon oxide film 102 formed on the silicon germanium layer 100 as illustrated FIG. 11B and the reflectance of the laser beam.

As evident in FIG. 11A, it is seen that the reflectance of the laser beam oscillates with respect to the thickness of the silicon oxide film.

Then, when the thickness of the silicon oxide film is, e.g., 35 nm, the reflectance is about 0.9, and when the laser beam of intensity 1 is applied, the intensity of the laser incident on the silicon germanium layer is 0.1.

On the other hand, when the thickness of the silicon oxide film is 0 nm, i.e., no silicon oxide film is formed on the silicon germanium layer, the reflectance is about 0.2, and when the laser of intensity 1 is applied, the intensity of the laser beam incident on the silicon germanium layer is 0.8.

As described above, the intensity of the incident laser beam can be controlled by the presence and the thickness of the silicon oxide film as the insulation film formed on the silicon germanium layer. Accordingly, as described above, the thickness of the silicon oxide film 70 formed on the silicon germanium layer 48 in the NMOS transistor region 16 and the thickness of the silicon oxide films 46, 70 formed on the silicon layer 34 in the PMOS transistor region 20 are respectively suitably set, whereby the silicon germanium layer 48 can be heated at a temperature sufficient for the lattice relaxation while the temperature rise of the silicon layer 34, etc. in the PMOS transistor region 20, which does not need to be heated, can be suppressed. Thus, the silicon germanium layer 48 can be selectively lattice-relaxed without affecting the PMOS transistor region 20.

(c) Relationship between the wavelength of the laser beam, the pulse width, etc., and the lattice- relaxation In order to effectively lattice-relax the silicon germanium layer, it is preferable that the laser beam is absorbed by the surface of the silicon germanium layer to generate a steep thermal gradient in the layer including the silicon germanium layer. This can be realized by suitably setting the wavelength, the pulse width of the laser beam to be applied, or the composition ratio of the germanium in the silicon germanium layer.

As illustrated in FIG. 12, as the wavelength of the laser beam to be applied is shorter, it is more difficult for the laser beam to arrive at the lower layers below a silicon germanium layer/a silicon layer 108 (a silicon oxide film 106 and a silicon substrate 104). In contrast to this, as the wavelength of the laser beam is longer, it is easier for the laser beam to arrive at the lower layers below the silicon germanium layer/the silicon layer 108 (the silicon oxide film 106 and the silicon substrate 104). Accordingly, when the wavelength of the laser beam to be applied is long, the whole layer including the silicon germanium layer heats, and it is difficult to generate an steep temperature gradient. This phenomenon depends on the absorption coefficients of the silicon germanium layer, the silicon layer, etc. As for the silicon germanium layer, it is known that as the composition ratio of the germanium is higher, the absorption coefficient on the longer wavelength side becomes larger. That is, the composition ratio of the germanium in the silicon germanium layer is made higher, whereby the laser beam of even a long wavelength can be absorbed only in the surface layer of the silicon germanium layer.

Accordingly, the wavelength of the laser beam to be applied and the composition ratio of the germanium in the silicon germanium layer are suitably set, whereby the applied laser beam can be absorbed only in the surface layer of the silicon germanium layer, and a thermal gradient can be generated in the layer including the silicon germanium layer, which can more effectively lattice-relax the compression-strained silicon germanium layer.

For example, to the laser beam of a 308 nm-wavelength, silicon and germanium exhibit a substantially the same light absorption coefficient of about $1 \times 10^6$ cm$^{-1}$, and most of the laser beam is absorbed in the surface layer of an about 10 nm-depth of the silicon germanium layer. Resultantly, the heat generated in the surface layer goes on being conducted to the lower layer. Then, in the interface 1 between the silicon layer below the silicon germanium layer and the silicon oxide layer below the silicon layer, a steep thermal gradient is generated due to the heat conductivity difference. This causes slip, and the compression-strained silicon germanium layer is lattice-relaxed.

The thermal gradient generated by the application of the laser beam goes on being extinguished as time passes. Thus, when the applied laser beam has a large pulse width, when the laser beam is a continuous wave, or in other cases, it is difficult to generate a steep thermal gradient, and it is often difficult to lattice-relax the compression-strained silicon germanium layer. Accordingly, the pulse width of the laser beam is preferably set as small as possible in the order of 10's-100's ns, such as, e.g., 20-40 ns.

Setting the substrate temperature high at the time of applying the laser beam produces the effect equivalent to setting the pulse width large. Accordingly, the substrate temperature must be set at a suitable value. For example, the substrate temperature is preferably set at the room temperature to 400° C.

Laser beam sources which satisfy the above-described conditions regarding the wavelength and the pulse width can be a short-wavelength excimer laser of a 193 nm-wavelength, a 222 nm-wavelength, a 248 nm-wavelength, a 308 nm-wavelength or a 351-nm wavelength, etc. These short wavelength excimer lasers can realize small pulse widths of below 300 ns including 300 ns.

In contrast to this, the YAG laser and the ruby laser of a 690 nm-wavelength and a 1060 nm-wavelength have longer wavelengths and larger pulse widths of several ms in comparison with the above-described short wavelength excimer laser. Accordingly, the margin of the YAG laser and the ruby laser for setting conditions for sufficiently lattice-relaxing the silicon germanium layer will be often smaller than that of the short-wavelength excimer laser. For example, the YAG laser and the ruby laser, whose wavelengths are longer than that of the above-described short wavelength excimer laser, must apply laser beams of higher energy.

As for the CW (Continuous Wave) laser, etc., when laser beams are simply applied to, the temperature as a whole is raised. By the use of means of scanning the laser beams or others, the silicon germanium layer can be lattice-relaxed by the CW laser, etc.

(d) Relationship between the thickness of the silicon germanium layer and the lattice-relaxation FIG. 13 is a graph of the relationship between the thickness of the silicon germanium layer and the lattice-relaxation by the application of a laser beam of a 308 nm-wavelength. As shown, it is seen that as the thickness of the silicon germanium layer is increased, the sufficient lattice-relaxation becomes more difficult. Unless the wavelength of the laser beam to be applied is increased near a thickness of the silicon germanium layer exceeding 100 nm, the heat is not conducted to the interface 1 between the silicon germanium layer/silicon layer 108 and the silicon oxide film 106 therebelow, which makes it difficult to increase the temperature of the silicon germanium layer. Thus, when the thickness of the silicon germanium layer is large, the wavelength of the laser beam to be applied must be suitably set.

The inventors of the present application have experimentally confirmed that the silicon germanium layer can be largely lattice-relaxed by applying a laser beam of a 308 nm-wavelength, a 40 nm-pulse width and an intensity of above 200 mJ/cm$^2$ including 200 mJ/cm$^2$.

The laser beam is applied as detailed above, whereby the compression-strained silicon germanium layer 48 is lattice-relaxed to form the lattice-relaxed silicon germanium layer 22, and then the silicon oxide films 70, 46 formed on the silicon layer 34 in the PMOS transistor region 20 are removed. Thus, the silicon oxide film 70 is left on the lattice-relaxed silicon germanium layer 22 formed in the NMOS transistor region 16 while the silicon layer 34 in the PMOS transistor region 20 is exposed (see FIG. 9D).

Then, a compression-strained silicon germanium layer 36 of, e.g., a 40 nm-thickness is formed on the silicon layer 34 in the PMOS transistor region 20 by selective epitaxial growth using the silicon oxide film 70 as the selective growth mask.

Figure 14A:
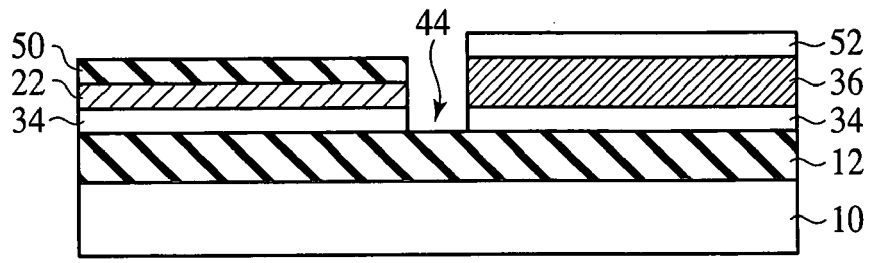
FIGS. 14A-14D are sectional views of the semiconductor device according to the third embodiment of the present invention in the steps of the method for fabricating the same, which illustrate the method (Part 2).
Figure 14B:
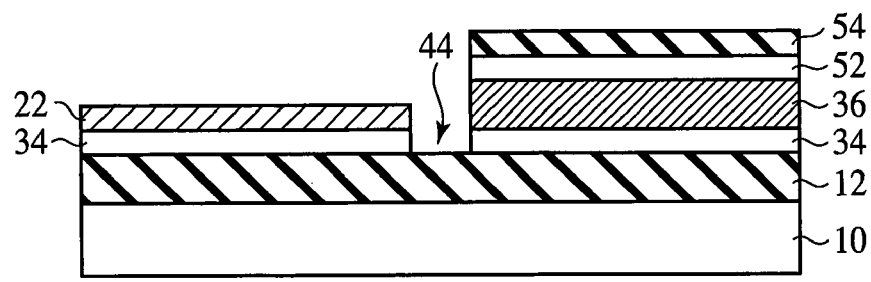
Figure 15A:
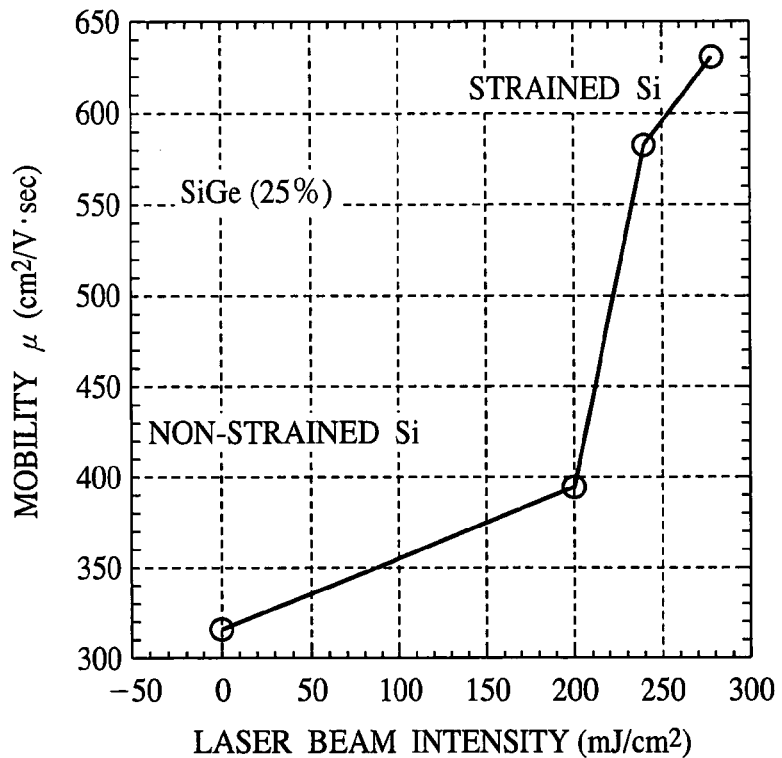
FIGS. 15A and 15B are graphs of the evaluation result.
Figure 15B:
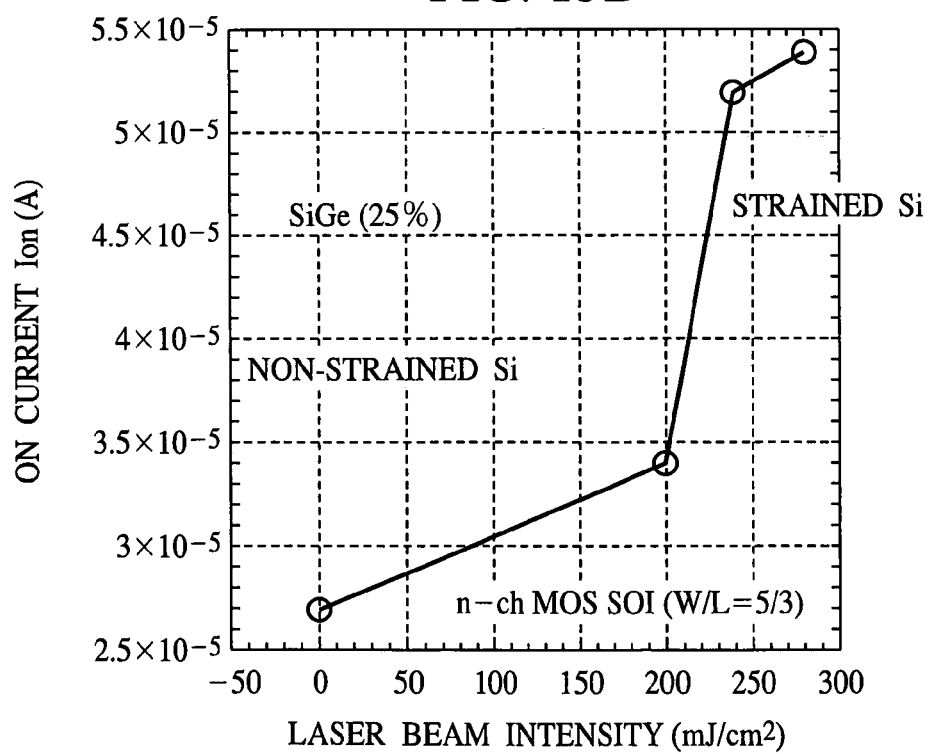

Next, a silicon layer 52 of, e.g., a 20 nm-thickness is formed on the silicon germanium layer 36 (see FIG. 14A).

Next, a silicon oxide film 54 is formed on the entire surface by, e.g., CVD. Subsequently, the silicon oxide films 54, 70 formed on the silicon germanium layer 22 in the NMOS transistor region 20 are removed. Thus, the silicon oxide film 54 is left on the silicon layer 52 in the PMOS transistor region 20 while the silicon germanium layer 22 in the NMOS transistor region 16 is exposed (see FIG. 14B).

Figure 14C:
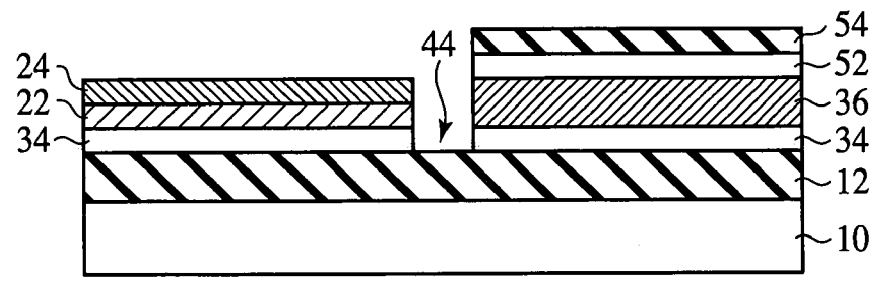

Then, a tensile-strained silicon layer 24 of, e.g., a 20 nm-thickness is formed on the silicon germanium layer 22 in the NMOS transistor region 16 by selective epitaxial growth using the silicon oxide film 54 as the selective growth mask (see FIG. 14C).

Figure 14D:
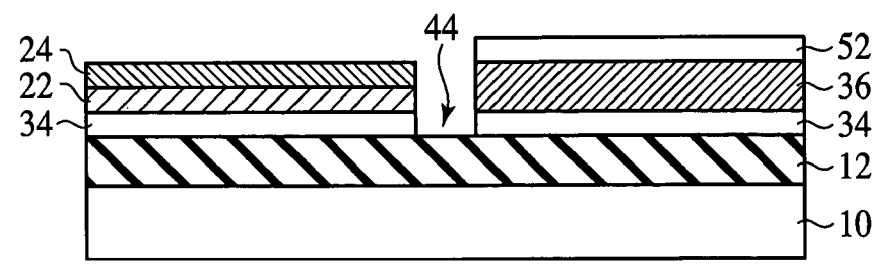

After the silicon layer 24 has been formed, the silicon oxide film 54 used as the selective growth mask is removed (see FIG. 14D).

After the compression-strained silicon germanium layer 36 has been formed in the PMOS transistor region 20, and the tensile-strained silicon layer 24 has been formed in the NMOS transistor region 16 as described above, the semiconductor device including the NMOS transistor 14 and the PMOS transistor 18 is fabricated in the same way as in the method for fabricating the semiconductor device according to the first embodiment illustrated in FIGS. 4C to 5D.

The semiconductor device fabricated by method for fabricating the semiconductor device according to the present embodiment has, in the NMOS transistor region 16, the structure of the insulation film 12 of silicon oxide film, the silicon layer 34, the lattice-relaxed silicon germanium layer 22 and the tensile-strained silicon layer 24 sequentially stacked on the silicon substrate 10, i.e., the structure of the insulation layer 12 sandwiched by silicon.

In contrast to this, the conventional NMOS transistor using as the channel the tensile-strained silicon layer formed using the SOI substrate has the structure of an insulation layer of silicon oxide film, a lattice-relaxed silicon germanium layer and a tensile-strained silicon layer sequentially stacked on a silicon substrate.

As described above, the semiconductor device fabricated by the method for fabricating the semiconductor device according to the present embodiment has the structural characteristic, which is largely different from the conventional transistor structure using the SOI substrate.

As described above, according to the present embodiment, a laser beam is applied to the compression-strained silicon germanium layer 48 through the silicon oxide films of different thicknesses to thereby lattice-relax the silicon germanium layer 48, whereby the compression-strained silicon germanium layer 48 can be selectively lattice-relaxed in a short period of time without influencing the semiconductor layer, etc. formed in the other region.

The NMOS transistor 14 using the tensile-strained silicon layer 24 as the channel and the PMOS transistor 18 using the compression-strained silicon germanium layer 36 as the channel are formed on one and the same SOI substrate 42, whereby the integrated transistor of high performance can be provided.

In either of the NMOS transistor region 16 and the PMOS transistor region 20, the insulation layer 12 of the SOI substrate 42 does not have to be removed, whereby effects of the SOI structure, such as the parasitic capacitance decrease, electric power saving, etc. are never impaired.

The height of the surface of the tensile-strained silicon layer 24 in the NMOS transistor region 16 and the height of the surface of the compression-strained silicon germanium layer 36 in the PMOS transistor region 20 can be made substantially equal to each other, whereby the processing precision of the following fabricating process of the semiconductor device can be improved.

In the present embodiment, the laser beam is applied to the compression-strained silicon germanium layer 48 through the silicon oxide film, but silicon oxide film is not essential as long as an insulation film can transmit the laser beam. It is possible that an insulation film, e.g., a silicon nitride film or others is formed on the silicon germanium layer 48, and the laser beam is applied to the silicon germanium layer 48 through such insulation film.

Evaluation Result

FIGS. 15A and 15B are graphs of the result of the measured characteristics of the NMOS transistor using as the channel the tensile-strained silicon layer formed on the silicon germanium layer lattice-relaxed from compression-strained state by the application of laser beams. The intensity of the laser beam applied to the silicon germanium layer is taken on the horizontal axes in FIGS. 15A and 15B. The mobility p is taken on the vertical axis in FIG. 15A, and the ON current Ion corresponding to the mobility in FIG. 15A is taken on the vertical axis in FIG. 15B.

Based on the graphs of FIGS. 15A and 15B, it is seen that when the intensity of the applied laser beam is low, the mobility and the ON current are low and small. This is because the intensity of the laser beam is too low to sufficiently lattice-relax the silicon germanium layer, and resultantly the silicon layer formed thereon is insufficiently strained.

On the other hand, it is seen that as the intensity of the laser beam is increased, the mobility and the ON current are also increased. In comparison with the mobility and the ON current for 0 intensity of the laser beam, i.e., without the application of the laser beam, the application of the laser beam even doubles the mobility and the ON current. This is because as the power density of the laser beam is increased, the silicon germanium layer is sufficiently lattice-relaxed, and the silicon layer formed thereon is sufficiently tensile-strained.

As described above, the application of a laser beam of a prescribed intensity can sufficiently lattice-relax the compression-strained silicon germanium layer and the silicon layer formed thereon becomes sufficiently tensile-strained state. Thus, the NMOS transistor using the tensile-strained silicon layer as the channel and having high mobility and large ON current can be provided.

Fourth Embodiment

Figure 16A:
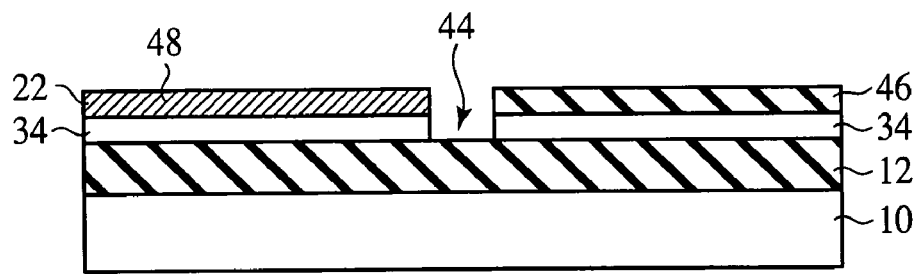
FIGS. 16A and 16B are sectional views of the semiconductor device according to a fourth embodiment of the FIGS. 17A-17D are sectional views of the semiconductor device according to a fifth embodiment of the present invention in the steps of the method for fabricating the same, which illustrate the method (Part 1)
Figure 16B:
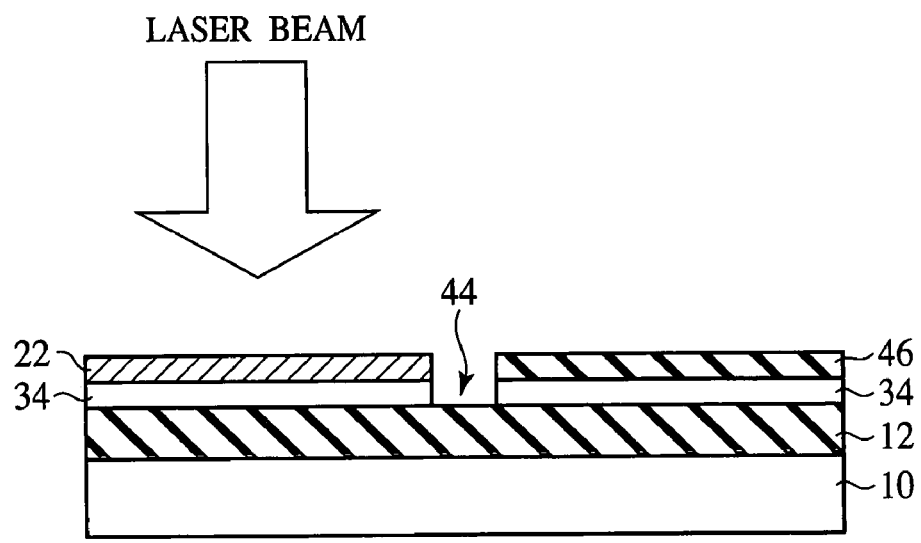

The semiconductor device and the method for fabricating the same according to a fourth embodiment of the present invention will be explained with reference to FIGS. 16A and 16B. FIGS. 16A and 16B are sectional views of the semiconductor device according to the present embodiment in the steps of the method for fabricating the same, which illustrate the method. The same members of the present embodiment as those of the method for fabricating the semiconductor device according to the third embodiment are represented by the same reference numbers not to repeat or to simplify their explanation.

The method for fabricating the semiconductor device according to the present embodiment is substantially the same as the method for fabricating the semiconductor device according to the third embodiment illustrated in FIGS. 9A to 9D and FIGS. 14A to 14D. The method for fabricating the semiconductor device according to the present embodiment is different from the method for fabricating the semiconductor device according to the third embodiment in that laser beams are applied only to the region where a compression-strained silicon germanium layer is formed to thereby lattice-relax the compression-strained silicon germanium layer 48 to form a lattice-relaxed silicon germanium layer 22.

First, in the same way as in the method for fabricating the semiconductor device according to the third embodiment, a compression-strained silicon germanium layer 48 is formed on a silicon layer 34 in the NMOS transistor region 16 (see FIG. 16A).

Then, the beam spot of a laser beam is adjusted into a prescribed size, and the laser beam is applied directly and selectively to the region of the NMOS transistor region 16, where the compression-strained silicon germanium layer 48 is formed. Thus, the compression-strained silicon germanium layer 48 is lattice-relaxed, and the lattice-relaxed silicon germanium layer 22 is formed (see FIG. 16B). Conditions for applying the laser beam can be the same as those in, e.g., the method for fabricating the semiconductor device according to the third embodiment, but it is preferable to suitably adjust the conditions in accordance with the presence and absence of a silicon oxide film on the silicon germanium layer 48.

In the method for fabricating the semiconductor device according to the present embodiment, the laser beam is applied selectively only to the region of the NMOS transistor region 16, where the compression-strained silicon germanium layer 48 is formed, whereby the compression-strained silicon germanium layer 48 can be lattice-relaxed without influencing a PMOS transistor region 20. It is not necessary either to form in advance the silicon oxide film in a prescribed thickness on the PMOS transistor region 20 for the purpose of suppressing the temperature rise of the silicon layer 34, etc. in the PMOS transistor region 20, to which the application of the laser beam is unnecessary.

Hereafter, in the same way as in the method for fabricating the semiconductor device according to the third embodiment, the semiconductor device including an NMOS transistor 14 and a PMOS transistor 18 is fabricated.

As described above, according to the present embodiment, the laser beam is applied selectively only to the region where the compression-strained silicon germanium layer 48 is formed, whereby the compression-strained silicon germanium layer 48 can be selectively lattice-relaxed in a short period of time without influencing the semiconductor layer, etc. in the rest region.

In the present embodiment, the laser beam is applied directly only to the region of the NMOS transistor region 16, where the silicon germanium layer 48 is formed, but it is possible that an insulation film, such as silicon oxide film or others, is formed on the silicon germanium layer 48, and the laser beam may be applied through the insulation film.

A Fifth Embodiment

The method for fabricating the semiconductor device according to a fifth embodiment of the present invention will be explained with reference to FIGS. 17A to 19C. FIGS. 17A to 19C are sectional view of the semiconductor device according to the present embodiment in the steps of the method for fabricating the same, which illustrate the method. The same members of the present embodiment as those of the method for fabricating the semiconductor device according to the first embodiment are represented by the same reference numbers not to repeat or to simplify their explanation.

The method for fabricating the semiconductor device according to the present embodiment is for fabricating a semiconductor device comprising an NMOS transistor and a PMOS transistor both of which use a tensile-strained silicon layer as the channel.

Figure 17A:
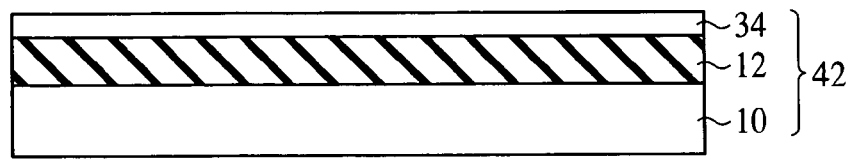
Figure 17B:
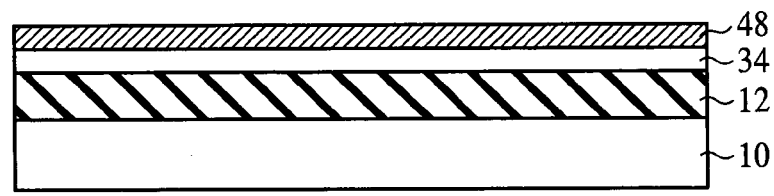

First, a compression-strained silicon germanium layer 48 of, e.g., a 40 nm-thickness is formed by epitaxial growth on the silicon layer 34 of the SOI substrate 42 illustrated in FIG. 17A (see FIG. 17B).

Figure 17C:
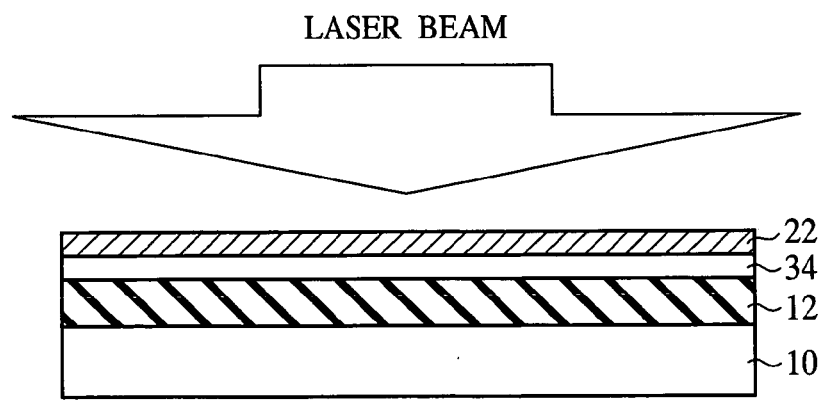

Then, a laser beam is applied to the silicon germanium layer 48 to thereby lattice-relax the compression-strained silicon germanium layer 48 to form a lattice-relaxed silicon germanium layer 22 (see FIG. 17C). To apply the laser beam, it is possible to form an insulation film, such as silicon oxide film or others, on the silicon germanium layer 48 and apply the laser beam through the silicon oxide film as in the method for fabricating the semiconductor device according to the third embodiment, or to apply the laser beam directly to the silicon germanium layer 48 as in the method for fabricating the semiconductor device according to the fourth embodiment.

Figure 17D:
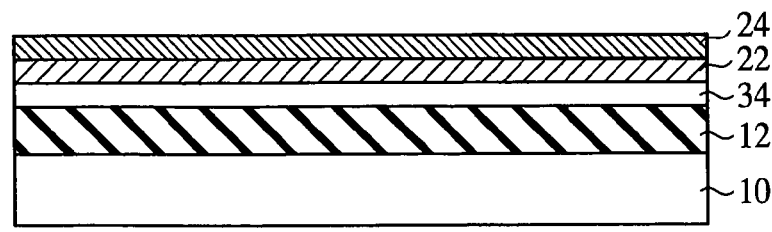

Next, the tensile-strained silicon layer 24 of, e.g., a 20 nm-thickness is formed by, e.g., CVD on the lattice-relaxed silicon germanium layer 22 (see FIG. 17D).

Figure 18A:
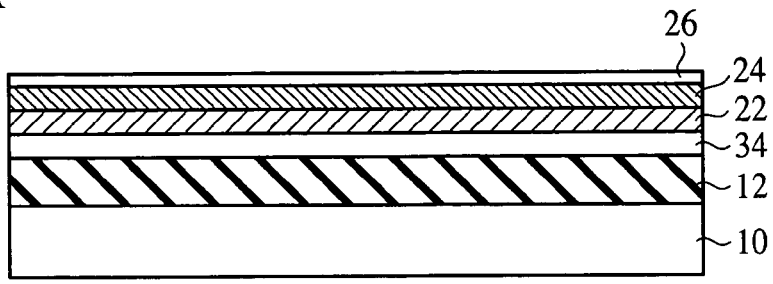
FIGS. 18A-18C are sectional views of the semiconductor device according to the fifth embodiment of the present invention in the steps of the method for fabricating the same, which illustrate the method (Part 2).

Next, a gate insulation film 26 of, e.g., a 2 nm-thickness silicon oxide film on the surface of the silicon layer 24 by, e.g., thermal oxidation (see FIG. 18A).

Figure 18B:
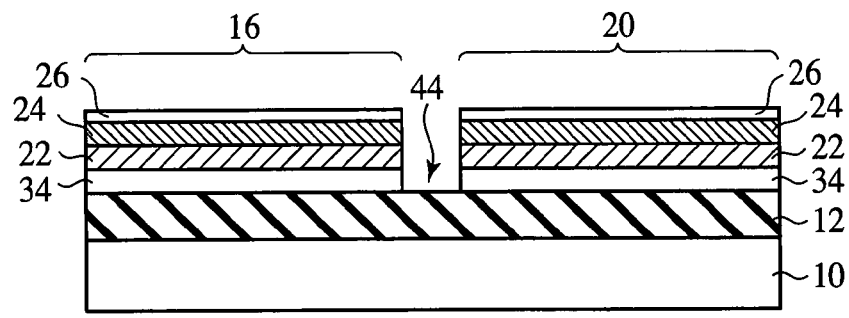

Next, the gate insulation film 26, the silicon layer 24, the silicon germanium layer 22 and the silicon layer 34 are respectively etched to form a trench 44 to thereby define an NMOS transistor region 16 and a PMOS transistor region 20 (see FIG. 18B). The device isolation step may be conducted before the application of the laser beam.

Next, a polysilicon film (not illustrated) of, e.g., a 120 nm-thickness is formed on the entire surface by, e.g., CVD.

Figure 18C:
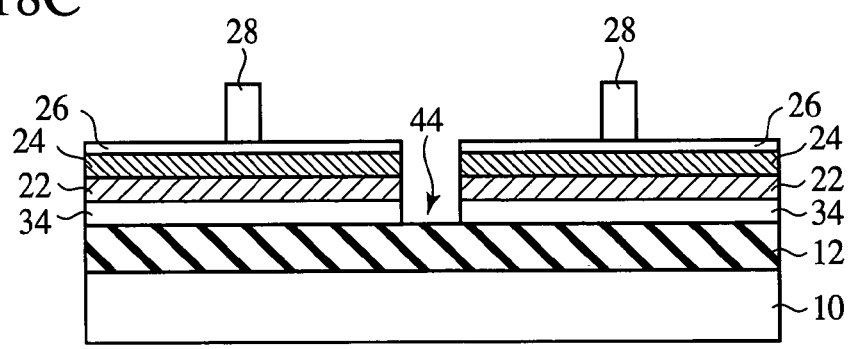
Figure 18D:
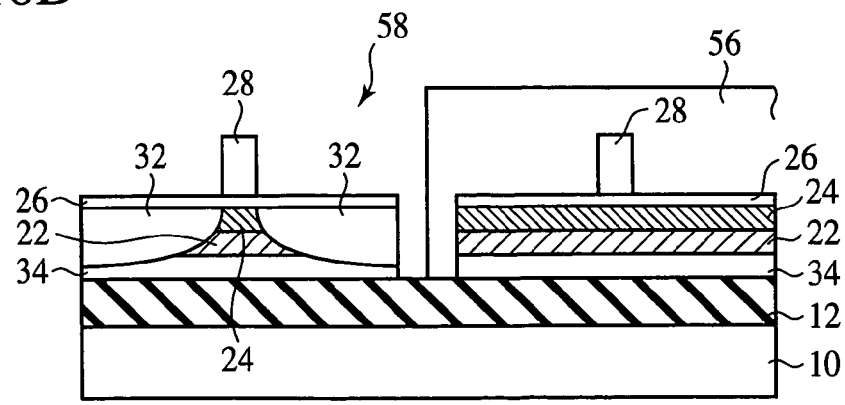

Next, the polysilicon film is etched by photolithography and etching to form gate electrodes 28 of the polysilicon film respectively in the NMOS transistor region 16 and the PMOS transistor region 20 (see FIG. 18C).

Next, a resist film 56 is formed on the entire surface by, e.g., spin coating. Then, the resist film 56 is patterned by photolithography to form an opening 58 for exposing the NMOS transistor region 16 in the resist film 56.

Then, with the gate electrode 28 and the resist film 56 as the mask, a dopant impurity, e.g., phosphorus is ion-implanted. Thus, source/drain diffused layers 32 are formed in the silicon layer 24 and the silicon germanium layer 22 on both sides of the gate electrode 28 (see FIG. 18D).

After the source/drain diffused layers 32 have been formed, the resist film 56 used as the mask is removed.

Then, a resist film 60 is formed on the entire surface by, e.g., spin coating. Then, the resist film 60 is patterned by photolithography to thereby form an opening for exposing the PMOS transistor region 20 in the resist film 60.

Next, with the gate electrode 28 and the resist film 60 as the mask, a dopant impurity, e.g., boron is ion-implanted. Thus, source/drain diffused layers 38 are formed in the silicon layer 24 and the silicon germanium layer 22 on both sides of the gate electrode 28 (see FIG. 19A).

After the source/drain diffused layers 38 have been formed, the resist film 60 used as the mask is removed.

After the source/drain diffused layers 32, 38 have been formed, the dopant impurities implanted in the source/drain diffused layers 32, 38 are activated by, e.g., thermal processing.

Figure 19A:
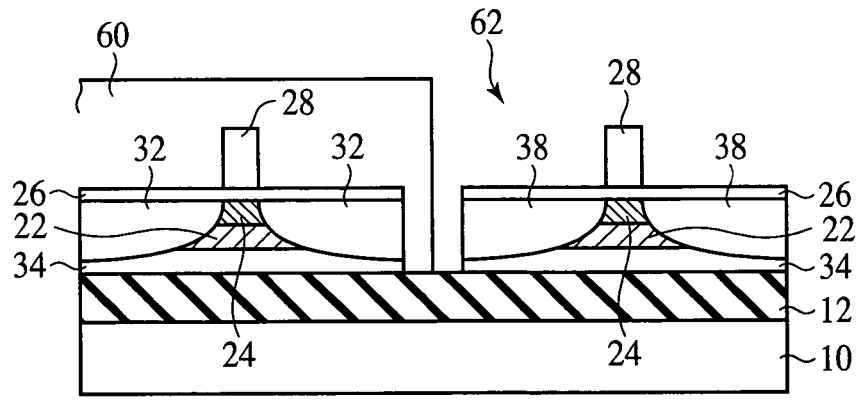
FIGS. 19A-19C are sectional views of the semiconductor device according to the fifth embodiment of the present invention in the steps of the method for fabricating the same, which illustrate the method (Part 3).
Figure 19B:
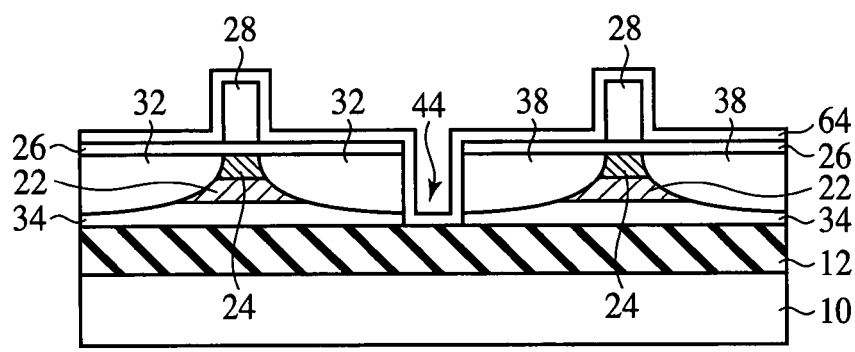

Next, a silicon oxide film 64 of, e.g., a 100 nm-thickness is formed on the entire surface by, e.g., CVD (see FIG. 19B).

Figure 19C:
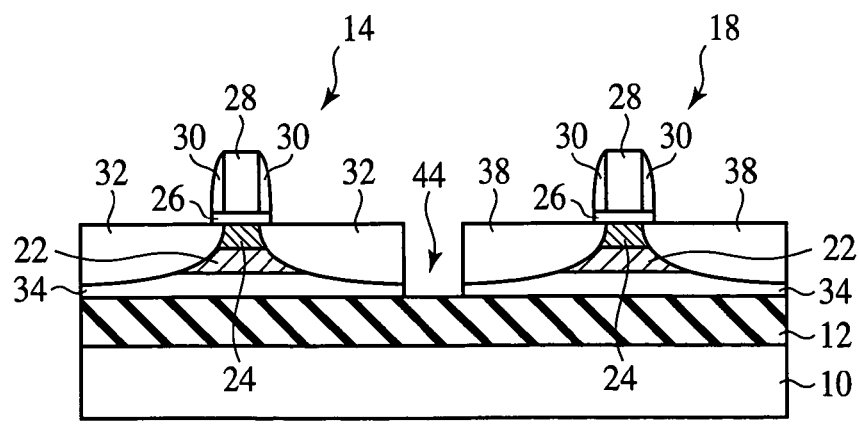

Then, the silicon oxide film 64 is anisotropically etched to thereby form sidewall insulation films 30 of the silicon oxide film 64 on the side walls of the gate electrodes 28 (see FIG. 19C).

Thus, the semiconductor device comprising the NMOS transistor 14 and the PMOS transistor 18 both using the tensile-strained silicon layer 24 as the channels is fabricated.

Also in fabricating the semiconductor device comprising the NMOS transistor and the PMOS transistor both using the tensile-strained silicon layer 24 as the channel, a laser beam is applied to thereby lattice-relax the compression-strained silicon germanium layer 48 as in the method for fabricating the semiconductor device according to the present embodiment.

A Sixth Embodiment

The method for fabricating the semiconductor device according to a sixth embodiment of the present invention will be explained with reference to FIGS. 20A to 21C. FIGS. 20A to 21C are sectional views of the semiconductor device according to the present embodiment in the steps of the method for fabricating the same, which illustrate the method. The same members of the present embodiment as those of the method for fabricating the semiconductor device according to the first embodiment are represented by the same reference numbers not to repeat or to simplify their explanation.

The method for fabricating the semiconductor device according to the present embodiment is characterized mainly in that when a laser beam is applied to lattice-relax a compression-strained silicon germanium layer to form a lattice-relaxed silicon germanium layer, a silicon layer as a cap layer is formed in advance on the compression-strained silicon germanium layer.

Figure 20A:
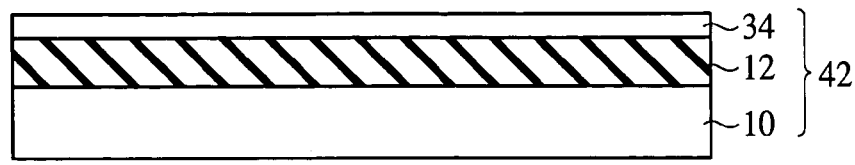
FIGS. 20A-20D are sectional views of the semiconductor device according to a sixth embodiment of the present invention in the steps of the method for fabricating the same, which illustrate the method (Part 1).

First, a compression-strained silicon germanium layer 48 of, e.g., a 40 nm-thickness is formed by epitaxial growth on the silicon layer 34 of the SOI substrate 42 illustrated in FIG. 20A.

Figure 20B:
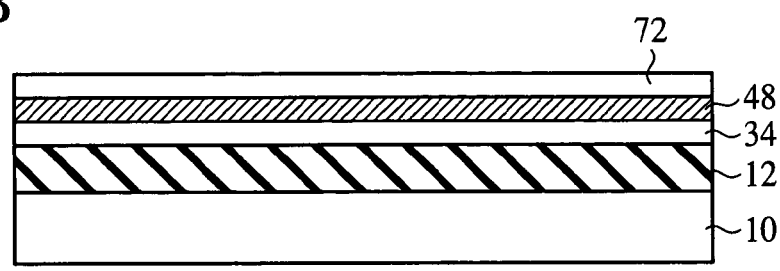
Figure 20C:
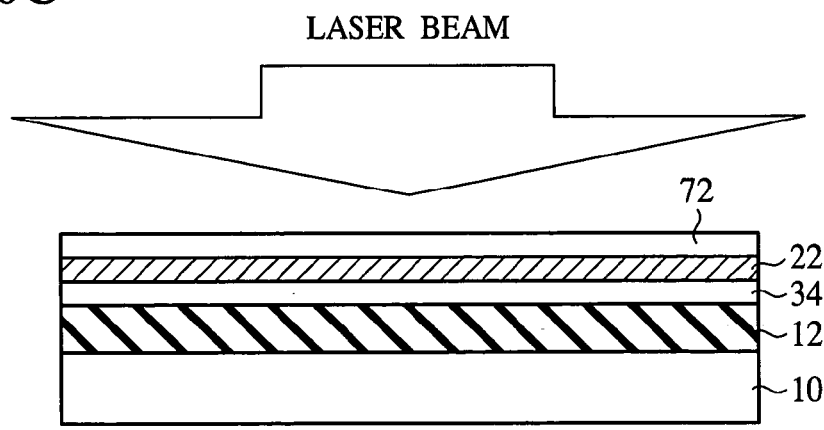

Next, a silicon layer 72 of, e.g., a 2 nm-thickness is formed as a cap layer on the compression-strained silicon germanium layer 48 by, e.g., CVD (see FIG. 20B).

Then, a laser beam is applied from the side of the silicon substrate 10 where the silicon layer 72 is formed to the compression-strained silicon germanium layer 48 through the silicon layer 72. Conditions for applying the laser beam can be substantially the same as those in, e.g., the method for fabricating the semiconductor device according to the third embodiment. Thus, the compression-strained silicon germanium layer 48 is lattice-relaxed and becomes the lattice-relaxed silicon germanium layer 22 (see FIG. 20C).

In the method for fabricating the semiconductor device according to the present embodiment, when a laser beam is applied to thereby lattice-relax the compression-strained silicon germanium layer 48 to form the lattice-relaxed silicon germanium layer 22, a silicon layer 72 of good heat resistance has been formed on the compression-strained silicon germanium layer 48. Accordingly, the generation of defects in the silicon germanium layer 48 (22) by the application of the laser beam can be prevented.

Furthermore, the silicon layer 72 has good chemical resistance, which allows the SOI substrate 42 with the lattice-relaxed silicon germanium layer 22 formed on to be processed with chemicals, of, e.g., etching, etc. with high reliability.

The thickness of the silicon layer 72 is not essentially 2 nm, but the silicon layer 72 is formed preferably in a thickness of below 5 nm including 5 nm. The silicon layer 72 is formed in a thickness of below 5 nm including 5 nm, whereby when the silicon layer 72 is oxidized later to be used as a gate oxide film, the silicon germanium layer 22 can be kept from being influenced. That is, when the silicon layer 72 is thick, the thermal oxidation is conducted for a long period of time, and the lattice-relaxed state of the silicon germanium layer 22 is often changed. However, the silicon layer 72 is formed in a thickness of below 5 nm including 5 nm, whereby such change of the lattice-relaxed state can be hindered.

The silicon germanium layer 48 is lattice-relaxed by the application of the laser beam to be the lattice-relaxed silicon germanium layer 22, which makes the silicon layer 72 tensile-strained.

Figure 20D:
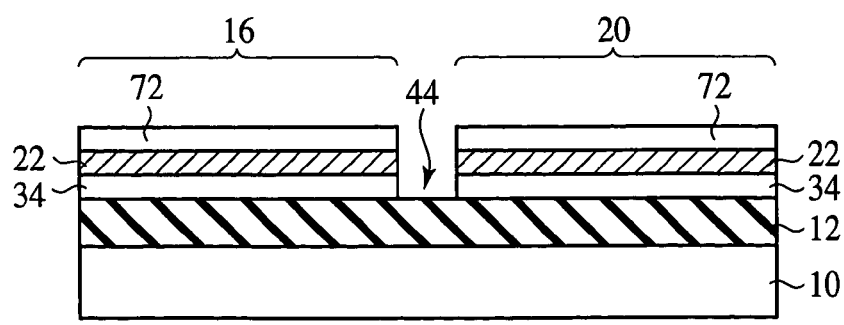

Then, the silicon layer 72, the silicon germanium layer 22 and the silicon layer 34 are respectively etched to form a trench 44 to define an NMOS transistor region 16 and a PMOS transistor region 20 (see FIG. 20D).

Figure 21A:
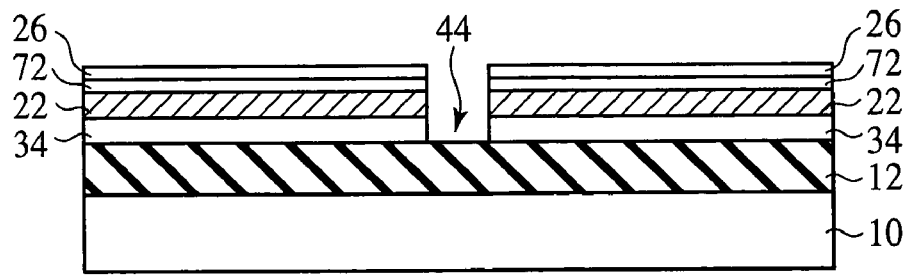
FIGS. 21A-21C are sectional views of the semiconductor device according to the sixth embodiment of the present invention in the steps of the method for fabricating the same, which illustrate the method (Part 2).
Figure 21B:
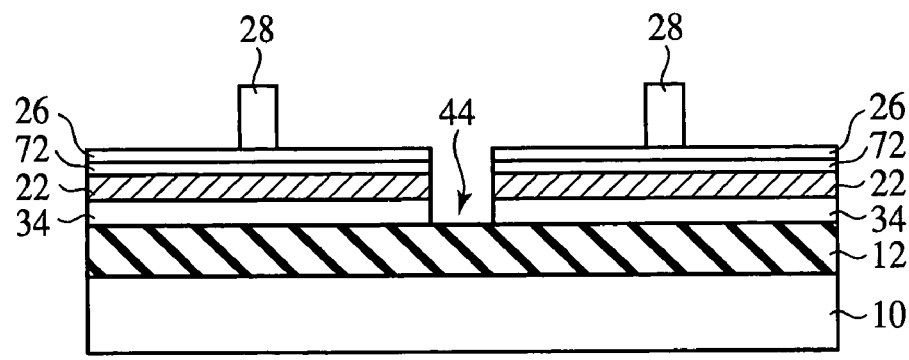

Then, on the silicon layer 72, a gate insulation film 26 of a silicon oxide film of, e.g., a 2 nm-thickness is formed by, e.g., thermal oxidation (see FIG. 21A).

Figure 21C:
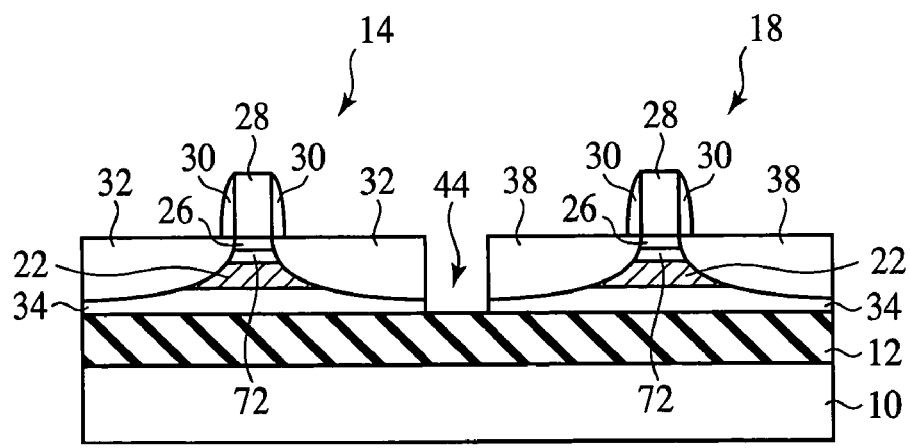

Hereafter, in the same way as in the method for fabricating the semiconductor device according to the first embodiment, gate electrodes 28 are formed respectively in the NMOS transistor region 16 and the PMOS transistor region 20 (see 21B), and then source/drain diffused layers 32, 38 and sidewall insulation films 30 are respectively formed (see FIG. 21C).

Thus, the semiconductor device comprising the NMOS transistor 14 and the PMOS transistor 18 both using as the channels the silicon layer 72 formed as the cap layer is fabricated.

As described above, according to the present embodiment, when the silicon germanium layer 48 is lattice-relaxed by the application of a laser beam, owing to the silicon layer 72 of good heat resistance and chemical resistance formed on the silicon germanium layer 48, the generation of defects due to the thermal processing can be prevented, and the following processing with chemicals can be conducted easily with high reliability.

A Seventh Embodiment

The method for fabricating the semiconductor device according to a seventh embodiment of the present invention will be explained with reference to FIGS. 22A-22D. FIGS. 22A-22D are sectional views of the semiconductor device according to the present embodiment in the steps of the method for fabricating the same, which illustrate the method. The same members of the present embodiment as those of the method for fabricating the semiconductor device according to the first embodiment are represented by the same reference numbers not to repeat or to simplify their explanation.

In fabricating a semiconductor device using an SOI substrate, devices, such as a MOS transistor, etc. are formed on the island-shaped semiconductor layer formed on the insulation layer. Accordingly, charges tend to be accumulated in the semiconductor layer, and often the potential changes upon an operation of semiconductor device. To prevent such state, in the MOS transistor, an electrode called a body contact is led out from the channel perpendicularly to the source/drain to thereby control the potential in the body region.

As one technique for leading out the body contact is known the technique called partial trench. In this technique, in an SOI layer, a trench which does not arrive at the insulation layer below the SOI layer is formed to lead out the body contact through the SOI layer at the lower part of the trench. This technique ensures a distance between the gate electrode and the body contact to thereby decrease the parasitic capacitance. However, the film thickness of the SOI layer is smaller as the devices are increasingly downsized, which makes it very difficult to stop the etching in the middle of the SOI layer.

In the present embodiment, a method for fabricating a semiconductor device which can easily form a body contact by utilizing the characteristic of the semiconductor device according to the present invention that an SOI layer is formed below a silicon germanium layer will be explained.

The method for fabricating the semiconductor device according to the present embodiment will be detailed below.

Figure 22A:
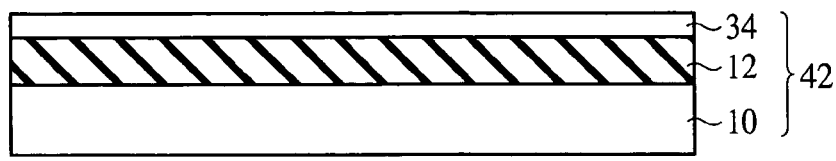
FIGS. 22A-22D are sectional views of the semiconductor device according to a seventh embodiment of the present invention in the steps of the method for fabricating the same, which illustrate the method.
Figure 22B:
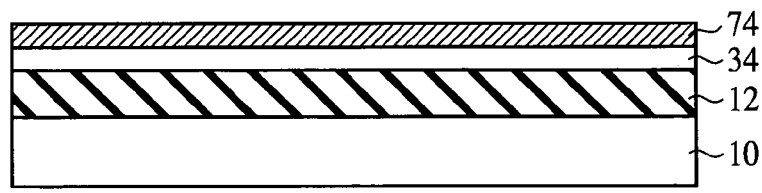
Figure 22C:
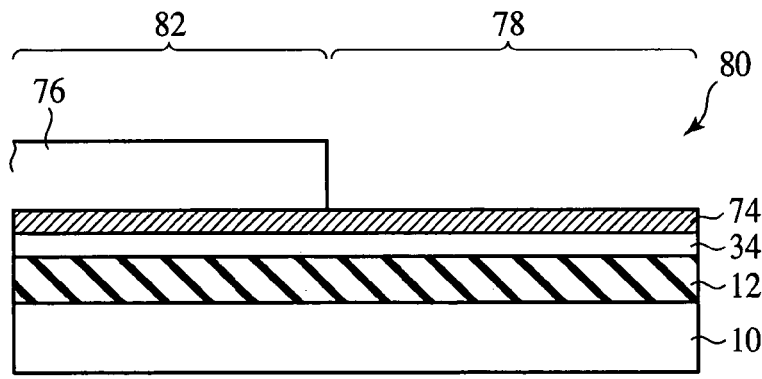
Figure 22D:
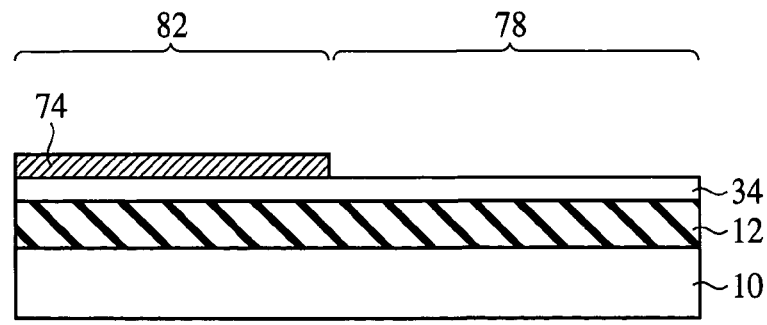

First, a compression-strained silicon germanium layer 74 is formed on the silicon layer 34 of the SOI substrate 42 illustrated in FIG. 22A (see FIG. 22B).

Then, a resist film 76 is formed on the silicon germanium layer 74 by, e.g., spin coating. Then, the resist film 76 is patterned by photolithography to form an opening 80 in the resist film 76 down to the silicon germanium layer 74 in a body contact region 78 where a body contact is to be formed while the resist film 76 is left in a transistor region 82 where a transistor is to be formed (see FIG. 22C).

Then, the silicon germanium layer 74 exposed in the opening 80 is removed by wet etching with the resist film 76 as the mask. The etching solution can be, e.g., a 1:16:24 mixed liquid of HF, $H_2O_2$ and $CH_3COOH$. The silicon layer 34 below the silicon germanium layer 74 is not etched with this etching solution.

After the wet etching has been completed, the resist film 76 used as the mask is removed (see FIG. 22D) Thus, the etching selectivity between the silicon germanium layer 74 and the silicon layer 34 is utilized to thereby easily expose the silicon layer 34 in the body contact region 78.

As described above, according to the present embodiment, the high etching selectivity between the silicon germanium layer 74 and the silicon layer 34 is utilized to thereby expose the silicon layer 34 in the body contact region 78, whereby an electrode for the body contact can be easily formed on the exposed silicon layer 34.

The step of forming the body contact described in the present embodiment can be suitably incorporated in, e.g., the steps of forming MOS transistors using as the channels the tensile-strained silicon layers 24, 72 formed on the silicon layer 34 with the lattice-relaxed silicon germanium layer 22 therebetween and using as the channels the compression-strained silicon germanium layer 36 formed on the silicon layer 34 as in the method for fabricating the semiconductor device according to the first to the sixth embodiments. In these cases, the electrode for the body contact can be easily led out from the channels of the NMOS transistor 16 and the PMOS transistor 18 in the direction normal to the source/drain.

MODIFIED EMBODIMENTS

The present invention is not limited to the above-described embodiments and can cover other various modifications.

Figure 23:
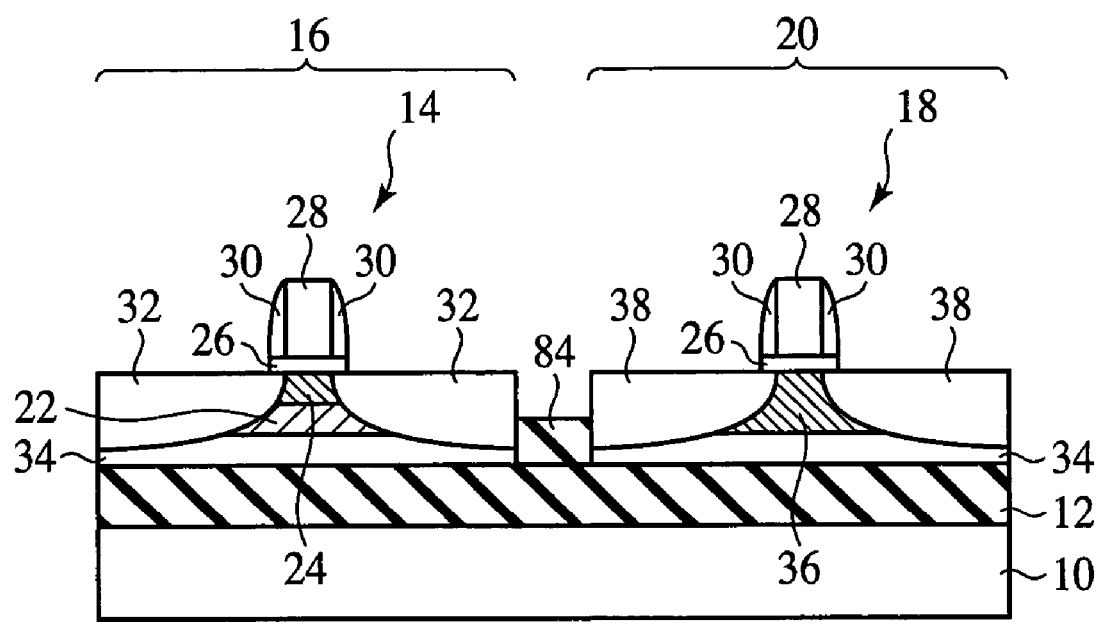
FIG. 23 is a sectional view of the semiconductor device according to a modification of the present invention, which illustrates a structure thereof.

For example, in the above-described embodiments, the NMOS transistor region 16 and the PMOS transistor region 20 are isolated from each other by the trench 44 formed by etching or the device isolation film 66 formed by LOCOS. However, the process for isolating the NMOS transistor region 16 and the PMOS transistor region 20 from each other is not limited to these methods. As exemplified in FIG. 23, the NMOS transistor region 16 and the PMOS transistor region 20 may be isolated from each other by a device isolation film 84 buried in a trench formed in the silicon layer 34 by STI (Shallow Trench Isolation).

In the above-described embodiments, the thicknesses of the respective layers forming the semiconductor device are set so that the height of the surface of the tensile-strained silicon layer 24 in the NMOS transistor region 16 and the height of the surface of the compression-strained silicon germanium layer 36 are substantially equal to each other, but the thicknesses of the respective layers are not essentially so set. The thicknesses of the respective layers can be set in accordance with performances, etc. required of the NMOS transistor 14 and the PMOS transistor 18. However, it is preferable that a step generated between the height of the surface of the tensile-strained silicon layer 24 in the NMOS transistor region 16 and the height of the surface of the compression-strained silicon germanium layer 36 in the PMOS transistor region 20 is sufficiently small to ensure the processing precision of the fabrication process.

In the above-described embodiments, the lattice-relaxed silicon germanium layer 22 in the NMOS transistor region 16 is formed, and then the compression-strained silicon germanium layer 36 in the PMOS transistor 20 is formed. However, the sequence of forming the respective layers forming the semiconductor device according to the present invention is not essentially this sequence. For example, it is possible that after the lattice-relaxed silicon germanium layer 22 in the NMOS transistor region 16, the tensile-strained silicon layer 24 in the NMOS transistor region 16 is subsequently formed, and then the compression-strained silicon germanium layer 36 in the PMOS transistor region 20 is formed.

In the above-described embodiments, after the compression-strained silicon germanium layer 48 has been formed on the silicon layer 34, the thermal processing is conducted to thereby form the lattice-relaxed silicon germanium layer 22. However, the process for forming the lattice-relaxed silicon germanium layer 22 is not limited to this. For example, a silicon germanium layer is formed in, e.g., an about 200 nm-thickness by selective growth, whereby a lattice-relaxed silicon germanium layer can be formed without the thermal processing. When the lattice-relaxed silicon germanium layer is thus formed without the thermal processing, the silicon germanium layer must be formed in some thickness. Accordingly, a step is often generated between the height of the surface of the tensile-strained silicon layer 24 in the NMOS transistor region 16 and the height of the surface of the compression-strained silicon germanium layer 36 in the PMOS transistor region 16. Even with the step generated, however, the NMOS transistor 14 using the tensile-strained silicon layer 24 as the channel and the PMOS transistor 18 using the compression-strained silicon germanium layer 36 as the channel can be formed on one and the same SOI substrate 42 without impairing the effect of the SOI structure, and the integrated transistor of high performance can be provided.

In the above-described embodiments, pulse-like laser beams are applied to lattice-relax the compression-strained silicon germanium layer 48. However, the laser beam to be applied is not limited to this. For example, a CW laser may be used to cause the laser beam to scan the silicon germanium layer 48 to thereby lattice-relax the compression-strained silicon germanium layer 48. It is possible to apply energy beams, such as electron beams, etc., in place of laser beams to thereby subject the silicon germanium layer 48 to the thermal processing of a short period of time to lattice-relax the silicon germanium layer 48. In place of the application of the laser beam, flush anneal using a lamp is conducted to lattice-relax the silicon germanium layer 48.

INDUSTRIAL APPLICABILITY

The semiconductor device and the method for fabricating the semiconductor device according to the present invention are useful for the semiconductor device comprising strained semiconductor layers and the method for fabricating the same, especially useful for the semiconductor device comprising transistors using a tensile-strained silicon layer and a compression-strained silicon germanium layer as the channels and the method for fabricating the same.

The invention claimed is:

1. A method for fabricating a semiconductor device comprising the steps of:
    forming a lattice-relaxed silicon germanium layer on a silicon layer in a first region, the silicon layer being formed on a substrate with an insulation layer formed therebetween;
    forming a tensile-strained silicon layer on the lattice-relaxed silicon germanium layer; and
    forming a compression-strained silicon germanium layer directly on the silicon layer in a second region,
    an NMOS transistor having the tensile-strained silicon layer as a channel and a PMOS transistor having the compression-strained silicon germanium layer as a channel being formed.

2. A method for fabricating a semiconductor device according to claim 1, wherein
    the step of forming the lattice-relaxed silicon germanium layer comprises the steps of:
    forming a compression-strained silicon germanium layer on the silicon layer in the first region; and lattice-relaxing the compression-strained silicon germanium layer by thermal processing.

3. A method for fabricating a semiconductor device according to claim 2, wherein
    in the step of lattice-relaxing the compression-strained silicon germanium layer, the thermal processing is conducted with an insulation film formed on the silicon layer in the second region.

4. A method for fabricating a semiconductor device according to claim 2, wherein
    in the step of lattice-relaxing the compression-strained silicon germanium layer, the thermal processing is conducted with an insulation film formed on the compression-strained silicon germanium layer and on the silicon layer in the second region.

5. A method for fabricating a semiconductor device according to claim 1, further comprising before the step of forming the lattice-relaxed silicon germanium layer, the step of
    isolating the first region and the second region of the silicon layer from each other.

6. A method for fabricating a semiconductor device according to claim 5, wherein
    in the step of isolating the first region and the second region of the silicon layer from each other, a trench is formed in the silicon layer down to the insulation layer to thereby isolate the first region and the second region of the silicon layer.

7. A method for fabricating a semiconductor device according to claim 5, wherein
    in the step of isolating the first region and the second region of the silicon layer from each other, a device isolation film is formed between the first region and the second region to thereby isolate the first region and the second region of the silicon layer from each other.

8. A method for fabricating a semiconductor device according to claim 1, wherein
    the step of forming the lattice-relaxed silicon germanium layer comprises the steps of:
    forming a compression-strained silicon germanium layer on the silicon layer in the first region; and
    applying an energy beam to the compression-strained silicon germanium layer to thereby lattice-relax the compression-strained silicon germanium layer.

9. A method for fabricating a semiconductor device according to claim 8, wherein
    in the step of lattice-relaxing the compression-strained silicon germanium layer, with an insulation film which can transmit the energy beam formed on the compression-strained silicon germanium layer and on the silicon layer in the second region, the energy beam is applied through the insulation film.

10. A method for fabricating a semiconductor device according to claim 9, wherein
    the insulation film on the compression-strained silicon germanium layer and the insulation film on the silicon layer in the second region are different from each other in thickness.

11. A method for fabricating a semiconductor device according to claim 8, wherein
    in the step of lattice-relaxing the compression-strained silicon germanium layer, the energy beam is applied selectively to the region containing the compression-strained silicon germanium layer and the energy beam is not applied to the silicon layer in the second region.

12. A method for fabricating a semiconductor device according to claim 8, wherein the energy beam is a laser beam.

13. A method for fabricating a semiconductor device according to claim 12, the laser beam is pulse-like.

14. A method for fabricating a semiconductor device according to claim 8, the energy beam is an electron beam.

15. A method for fabricating a semiconductor device according to claim 1, further comprising after the step of forming the silicon germanium layer, the steps of:
    removing the silicon germanium layer in a body contact region; and
    forming an electrode for the body contact on the silicon layer in the body contact region.

* * * * *